United States Patent
Kim et al.

(10) Patent No.: US 11,652,196 B2
(45) Date of Patent: May 16, 2023

(54) DISPLAY MODULE AND MANUFACTURING METHOD THEREOF

(71) Applicant: SAMSUNG ELECTRONICS CO., LTD., Suwon-si (KR)

(72) Inventors: Myunghee Kim, Suwon-si (KR); Donghwan Kim, Suwon-si (KR); Sungwook Kim, Suwon-si (KR); Yong Namkung, Suwon-si (KR); Jenghun Suh, Suwon-si (KR); Jaephil Shim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 97 days.

(21) Appl. No.: 17/024,833

(22) Filed: Sep. 18, 2020

(65) Prior Publication Data

US 2021/0111325 A1 Apr. 15, 2021

(30) Foreign Application Priority Data

Oct. 15, 2019 (KR) .......................... 10-2019-0128028
Nov. 25, 2019 (KR) .......................... 10-2019-0152622

(51) Int. Cl.
*H01L 33/62* (2010.01)
*H01L 33/00* (2010.01)
(Continued)

(52) U.S. Cl.
CPC .............. *H01L 33/62* (2013.01); *H01L 24/29* (2013.01); *H01L 24/83* (2013.01); *H01L 25/0753* (2013.01); *H01L 33/0093* (2020.05); *H01L 33/405* (2013.01); *H01L 33/42* (2013.01); *H01L 33/44* (2013.01); *H01L 33/58* (2013.01);
(Continued)

(58) Field of Classification Search
None
See application file for complete search history.

(56) References Cited

U.S. PATENT DOCUMENTS 6,388,696 B1 5/2002 Taninaka et al.
7,811,841 B2 10/2010 Ogihara
(Continued)

FOREIGN PATENT DOCUMENTS

CN 107068665 A * 8/2017 ......... H01L 25/0753
EP 0 436 024 B1 7/1995
(Continued)

OTHER PUBLICATIONS

Examination Report dated Feb. 16, 2022, issued by the European Patent Office in counterpart European Application No. 20201835.4.
(Continued)

*Primary Examiner* — Scott B Geyer
(74) *Attorney, Agent, or Firm* — Sughrue Mion, PLLC

(57) ABSTRACT

A display module and a manufacturing method thereof are provided. The manufacturing method may include forming an epitaxial film comprising a light emitting layer, a first type semiconductor layer, and a second type semiconductor layer, attaching the epitaxial film to an intermediate substrate comprising a conductive material, patterning the epitaxial film to form a light emitting diode (LED) and coupling the LED to a driving circuit layer through the conductive material.

15 Claims, 38 Drawing Sheets

(51) Int. Cl.
| | |
|---|---|
| H01L 23/00 | (2006.01) |
| H01L 25/075 | (2006.01) |
| H01L 33/40 | (2010.01) |
| H01L 33/42 | (2010.01) |
| H01L 33/44 | (2010.01) |
| H01L 33/58 | (2010.01) |

(52) U.S. Cl.
CPC ........... *H01L 2224/29239* (2013.01); *H01L 2224/29244* (2013.01); *H01L 2224/29255* (2013.01); *H01L 2224/29263* (2013.01); *H01L 2224/29269* (2013.01); *H01L 2224/29287* (2013.01); *H01L 2224/29293* (2013.01); *H01L 2224/83894* (2013.01); *H01L 2933/0016* (2013.01); *H01L 2933/0025* (2013.01); *H01L 2933/0058* (2013.01); *H01L 2933/0066* (2013.01)

(56) References Cited

U.S. PATENT DOCUMENTS

| | | | |
|---|---|---|---|
| 8,022,387 | B2 | 9/2011 | Ogihara et al. |
| 8,273,318 | B2 | 9/2012 | Asano |
| 8,900,893 | B2 | 12/2014 | Wang |
| 8,946,760 | B2 | 2/2015 | Kim |
| 9,219,197 | B1 | 12/2015 | Chen et al. |
| 9,236,525 | B2 | 1/2016 | Kim |
| 9,471,000 | B2 | 10/2016 | Nagamine |
| 9,472,535 | B2 | 10/2016 | Lagally et al. |
| 9,647,171 | B2 | 5/2017 | Rogers et al. |
| 10,128,308 | B1 * | 11/2018 | Shin .................. H01L 25/162 |
| 10,437,402 | B1 * | 10/2019 | Pan ................... H01L 23/5387 |
| 10,586,893 | B2 | 3/2020 | Kang et al. |
| 10,847,083 | B1 * | 11/2020 | Pan .................... H01L 25/50 |
| 11,398,464 | B2 * | 7/2022 | Iguchi ............... H01L 33/0753 |
| 2007/0292978 | A1 * | 12/2007 | Yeh ................... H01L 33/0093 438/22 |
| 2009/0224272 | A1 * | 9/2009 | Yu ...................... H01L 33/46 257/E33.001 |
| 2010/0090232 | A1 * | 4/2010 | Huang .................. H01L 33/08 257/89 |
| 2011/0003410 | A1 * | 1/2011 | Tsay .................. H01L 33/0093 977/932 |
| 2012/0080697 | A1 * | 4/2012 | Chen ................. H01L 25/0753 257/91 |
| 2012/0261695 | A1 * | 10/2012 | Chen ................... H01L 33/08 257/98 |
| 2013/0256735 | A1 | 10/2013 | Kim |
| 2015/0028362 | A1 * | 1/2015 | Chan ................... H01L 24/29 438/28 |
| 2015/0104890 | A1 | 4/2015 | Kim |
| 2015/0318444 | A1 * | 11/2015 | Huang ................. H01L 27/153 438/28 |
| 2016/0204305 | A1 * | 7/2016 | Chiu ................. H01L 33/0093 257/94 |
| 2017/0117257 | A1 * | 4/2017 | Lee ................... H01L 33/382 |
| 2018/0102085 | A1 * | 4/2018 | Pan ..................... H01L 33/30 |
| 2018/0182275 | A1 | 6/2018 | Ahmed et al. |
| 2018/0226386 | A1 | 8/2018 | Cok |
| 2018/0358339 | A1 * | 12/2018 | Iguchi ................. G09G 3/3233 |
| 2019/0131343 | A1 | 5/2019 | Templier et al. |
| 2019/0157234 | A1 | 5/2019 | Fathi et al. |
| 2019/0206926 | A1 * | 7/2019 | Diana ................. H01L 33/382 |
| 2019/0302917 | A1 | 10/2019 | Pan |
| 2019/0305202 | A1 | 10/2019 | Sakong et al. |
| 2020/0349882 | A1 | 11/2020 | Kim et al. |
| 2020/0350477 | A1 | 11/2020 | Shim et al. |

FOREIGN PATENT DOCUMENTS

| | | | | |
|---|---|---|---|---|
| EP | 0 881 686 | A2 | 12/1998 | |
| JP | 2006-82260 | A | 3/2006 | |
| JP | 2007-96160 | A | 4/2007 | |
| JP | 2012080089 | A * | 4/2012 | ......... H01L 25/0753 |
| JP | 5150361 | B2 | 2/2013 | |
| JP | 5364978 | B2 | 12/2013 | |
| JP | 6184372 | B2 | 8/2017 | |
| KR | 10-1012043 | B1 | 1/2011 | |
| KR | 10-1753066 | B1 | 7/2017 | |
| KR | 10-2018-0093767 | A | 8/2018 | |
| KR | 10-1891257 | B1 | 8/2018 | |
| KR | 10-2018-0102424 | A | 9/2018 | |
| KR | 10-2018-0118090 | A | 10/2018 | |
| KR | 10-2019-0115570 | A | 10/2019 | |
| KR | 10-2020-0127478 | A | 11/2020 | |
| KR | 10-2020-0127777 | A | 11/2020 | |

OTHER PUBLICATIONS

Jun Wang et al., "Silver Nanowire Electrodes: Conductivity Improvement Without Post-treatment and Application in Capacitive Pressure Sensors", Nano-Micro Lett., 7(1), DOI 10.1007/s40820-014-0018-0, Nov. 14, 2014, pp. 51-58, 8 pagestotal.

Ju Yeon Woo et al., "Highly conductive and stretchable Ag nanowire/carbon nanotube hybrid conductors", Nanotechnology, 25, doi:10.1088/0957-4484/25/28/285203, filed Jun. 27, 2014, pp. 1-7, 8 pages total.

Yoshihiro Kojima et al., "Growth of High-Quality Carbon Nanotubes by Grid-Inserted Plasma-Enhanced Chemical Vapor Deposition for Field Emitters", Japanese Journal of Applied Physics, vol. 44, No. 4B, Apr. 21, 2005, pp. 2600-2603, 5 pages total.

Hirofumi Ohnaka et al., "Fabrication of Carbon Nanotube Field Effect Transistors Using Plasma-Enhanced Chemical Vapor Deposition Grown Nanotubes", Japanese Journal of Applied Physics, vol. 45, No. 6B, Jun. 20, 2006, pp. 5485-5489, 6 pages total.

Ying Tao et al., "One-step and low-temperature deposited Ag nanowires/TiOx hybrid transparent conductive thin film and its application in antistatic coating", Material Research Express, 6, 076430, Apr. 24, 2019, pp. 1-7, 8 pages total.

Myunghee Kim et al., "AlGaN-Based Deep Ultraviolet Light-Emitting Diodes Fabricated on Patterned Sapphire Substrates", Applied Physics Express, 4, DOI: 10.1143/APEX.4.092102, Aug. 22, 2011, pp. 1-3, 4 pages total.

Kentaro Nagamatsu et al., "High-efficiency AlGaN-based UV light-emitting diode on laterally overgrown AlN", Journal of Crystal Growth, 310, Jan. 8, 2008, pp. 2326-2329, 4 pages total.

K. Nakano et al., "Epitaxial lateral overgrowth of AlN layers on patterned sapphire substrates", physics status solidi (a) 203, No. 7, DOI 10.1002/pssa.200565389, May 22, 2006, pp. 1632-1635, 4 pages total.

J. Mei et al.,"Dislocation generation at the coalescence of aluminum nitride lateral epitaxy on shallow-grooved sapphire substrates", Applied Physics Letters, 90, 221909, May 31, 2007, pp. 1-3, 4 pages total.

Communication dated Mar. 11, 2021, issued by the European Patent Office in counterpart European Application No. 20201835.4.

International Search Report (PCT/ISA/210) dated Dec. 11, 2020 by the Intellectual Searching Authority in counterpart International Patent Application No. PCT/KR2020/012165.

Written Opinion (PCT/ISA/237) dated Dec. 11, 2020 by the Intellectual Searching Authority in counterpart International Patent Application No. PCT/KR2020/012165.

Examination Report, issuance date: Mar. 3, 2023, issued by the European Patent Office for European Patent Application No. 20201835.4.

* cited by examiner

DISPLAY MODULE AND MANUFACTURING METHOD THEREOF

CROSS-REFERENCE TO RELATED APPLICATION(S)

This application is based on and claims priority under 35 U.S.C. § 119 to Korean Patent Application No. 10-2019-0128028, filed on Oct. 15, 2019 and Korean Patent Application No. 10-2019-0152622, filed on Nov. 25, 2019, in the Korean Intellectual Property Office, the disclosures of which are herein incorporated by reference in their entireties.

BACKGROUND

Field

Apparatuses and methods consistent with the disclosure relate to a display module and a manufacturing method thereof, and more particularly, to a display module for a micro light emitting diode (LED) and a manufacturing method thereof.

Description of the Related Art

A light emitting diode (LED) is a semiconductor element that emits light when a voltage is applied thereto, and is widely used as a light source for display devices for displaying images as well as general lighting devices.

Recently, a display device, a display panel, a display module, etc., using a micro LED (μ-LED), or a micro light emitting diode as a light source in unit of pixel or sub-pixel has been developed. Here, the micro LED may refer to a semiconductor light emitting element having a width, a length, and a height of 1 to 100 micrometers (μm), respectively.

A micro LED display module (or a display panel) using the micro LED as the light source provides better contrast, response time, and energy efficiency, compared to a liquid crystal display (LCD) that requires a separate backlight unit. Moreover, the micro LED display module using the micro LED has advantages such as less burn-in of a screen, longer life, higher luminance efficiency, and brighter brightness than an organic LED (OLED) that uses an inorganic material.

In general, in the case of a display module using the micro LED as the light source, the micro LED is used as a flip-chip structure, and the flip-chip structure requires bumps and pads for contacting the micro LED with a thin film transistor (TFT) circuit board. The bumps serve to align the heights of the positive electrodes (e.g., a positive-contact-metal and a negative-contact-metal) of the flip-chip, and serve to facilitate a connection of the contact-metals of the flip-chip with external electrodes (e.g., contact-metals of a circuit board). For such a reason, the bumps require a good adhesion between a final metal layer of a chip-pad and a metal layer of the circuit board and an electrical resistance to be low. In general, Au-Bump plating is mainly used as a material for the bumps. As an example, when the micro LED is transferred to a TFT circuit board through a stamp transfer process, an anisotropic conductive film (ACF) is used. Here, the ACF serves as a binder, and Ni particles contained in the ACF are each used for the purpose of facilitating the connection of the contact metals of the micro LED chip with the contact-metals of the TFT circuit board.

However, as a chip size of the micro LED is miniaturized, a gap between the positive electrodes (or the positive electrodes of the TFT substrate) becomes too narrow, and there is a problem in that a short occurs as the Ni particles invade a region of the positive electrodes.

In addition, bonding through the ACF or bump soldering requires a heat treatment process, and problems such as an occurrence of cracks and misalignment of micro LEDs occur in the bumps according to the heat treatment process. Due to the problems described above, the micro LED may not emit light properly, resulting in defective pixels, which in turn causes a decrease in yield for production of the display module.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

According to an aspect of the disclosure, there is provided a method of manufacturing a display module, the method comprising: forming an epitaxial film comprising a light emitting layer, a first type semiconductor layer, and a second type semiconductor layer; attaching the epitaxial film onto an intermediate substrate comprising a conductive material; patterning the epitaxial film to form a light emitting diode (LED); and electrically connecting the LED to a driving circuit layer through the conductive material.

The connecting the LED to the driving circuit layer may comprise: attaching the intermediate substrate onto the driving circuit layer formed on a substrate to electrically connect the first type semiconductor layer of the LED to the driving circuit layer through the conductive material and to electrically connect the second type semiconductor layer of the LED to the driving circuit layer through the conductive material.

The LED may have a vertical structure, and the conductive material may comprise at least one of carbon nano tube (CNT), graphene, or metal nano wire.

The driving circuit layer may comprise a pixel circuit, and a first electrode and a second electrode coupled to the pixel circuit to electrically connect the first electrode and the second electrode to the pixel circuit.

The method may further comprise forming a passivation element on a sidewall of the LED.

The connecting the second type semiconductor layer of the LED to the driving circuit layer may comprise forming a transparent electrode along the passivation element; and electrically connecting the second type semiconductor layer of the LED to the second electrode of the driving circuit layer through the transparent electrode and the conductive material.

The method may further comprise forming a black matrix on the intermediate substrate in a region between the LED and another LED.

The intermediate substrate may further comprise an adhesive material, and wherein the intermediate substrate is attached onto the driving circuit layer through the adhesive material to electrically connect the first type semiconductor layer of the LED to the first electrode of the driving circuit layer through the conductive material.

The adhesive material may comprise at least one of epoxy, polyimide, or phenol.

The method may further comprise forming a reflective electrode on a lower portion of the first type semiconductor layer or an upper portion of the second type semiconductor layer.

According to another aspect of the disclosure, there is provided a display module comprising: a substrate; a driving circuit layer provided on the substrate, the driving circuit layer comprising a pixel circuit and a plurality of electrodes configured to be electrically connected to the pixel circuit, wherein the plurality of electrodes comprise a first electrode and a second electrode; an intermediate substrate comprising a first conductive portion, a second conductive portion and an adhesive portion provided in different regions, respectively, the intermediate substrate being attached onto the driving circuit layer through the adhesive portion; and a light emitting diode (LED) provided on the intermediate substrate, wherein the plurality of electrodes include a first electrode and a second electrode, the LED comprises a light emitting layer, and a first type semiconductor layer and a second type semiconductor layer provided on upper and lower portions of the light emitting layer, respectively, the first type semiconductor layer is configured to electrically connect to the first electrode through the first conductive portion, and the second type semiconductor layer is configured to electrically connect to the second electrode through the second conductive portion.

The LED may have a vertical structure.

The display module may further comprise a passivation element provided on a sidewall of the LED.

The LED may further comprise a transparent electrode provided along the passivation element, and the second type semiconductor layer is configured to be electrically connected to the second electrode through the transparent electrode.

The display module may further comprise a black matrix provided on the intermediate substrate in a region between the LED and another LED.

The transparent electrode may be a same material as the first conductive portion and the second conductive portion of the intermediate substrate.

Each of the first conductive portion and the second conductive portion may comprise at least one of carbon nano tube (CNT), graphene, or metal nano wire.

The adhesive portion may comprise at least one of epoxy, polyimide, or phenol.

The display module may further comprise a reflective electrode provided on a lower portion of the first type semiconductor layer or an upper portion of the second type semiconductor layer.

According to another aspect of the disclosure, there is provided a display device comprising: a substrate; a driving circuit layer provided on the substrate, the driving circuit layer comprising a pixel circuit, a first electrode and a second electrode; an intermediate substrate comprising a first portion and a second portion having a conductive material, and a third portion having an adhesive material, the intermediate substrate being attached to the driving circuit layer through the adhesive material in the third portion; a light emitting diode (LED) provided on the intermediate substrate and having a light emitting layer, and a first type semiconductor layer and a second type semiconductor layer, wherein the first type semiconductor layer is electrically connectable to the first electrode through the conductive material in the first portion, and wherein the second type semiconductor layer is electrically connectable to the second electrode through the conductive material in the second portion.

The display module may further comprise a first path configured to electrically connect the first electrode to the first type semiconductor layer of the LED through the conductive material in the first portion of the intermediate substrate.

The display module may further comprise a second path to electrically connect the second electrode to the second type semiconductor layer of the LED through the conductive material in the second portion of the intermediate substrate.

According to another aspect of the disclosure, there is provided a method of forming a display device comprising: forming an epitaxial film comprising a light emitting layer, a first type semiconductor layer, and a second type semiconductor layer; forming an intermediate substrate including a first portion and a second portion having a conductive material, and a third portion having an adhesive material; attaching the epitaxial film to the intermediate substrate through the adhesive material in the third portion of the intermediate substrate; patterning the epitaxial film to form a light emitting diode (LED); and attaching the intermediate substrate to a driving circuit layer through the adhesive material in the third portion, the driving circuit layer including a pixel circuit, a first electrode and a second electrode.

The method may further comprise forming a first path to electrically connect the first electrode to the first type semiconductor layer of the LED through the conductive material in the first portion of the intermediate substrate.

The method may further comprise forming a second path to electrically connect the second electrode to the second type semiconductor layer of the LED through the conductive material in the second portion of the intermediate substrate.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

Figure 1:
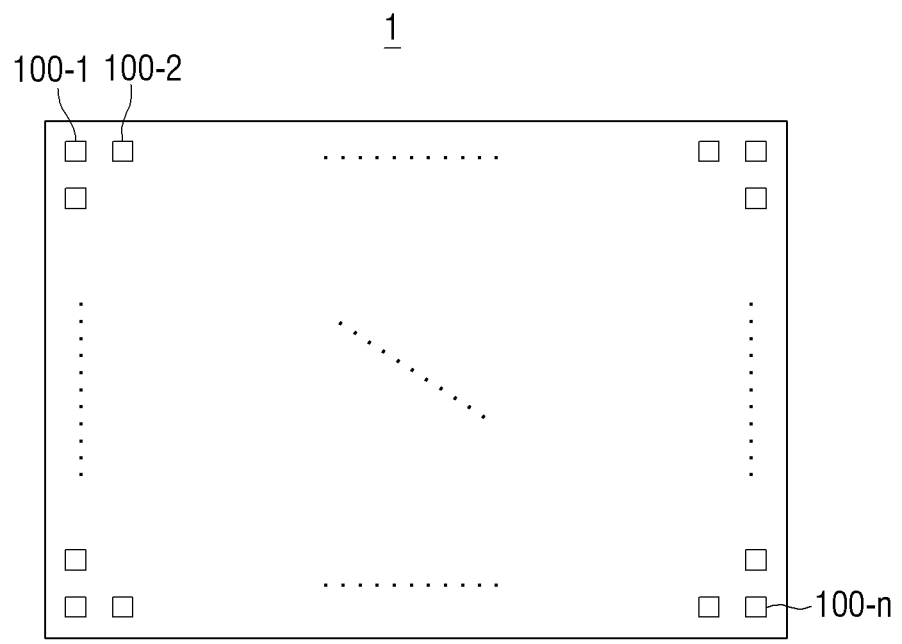
FIG. 1 is a view for describing a display module according to an embodiment of the disclosure.

An object of the disclosure is to provide a display module and a manufacturing method thereof that solve various problems such as a defect rate, a non-illumination rate, and a reduction in yield of the related art μ-LED process while alleviating the limitations of the related art μ-LED structure.

In describing the disclosure, a detailed description for the known functions or configurations related to the disclosure, which may unnecessarily obscure the gist of the disclosure, may be omitted. In addition, the following embodiments may be modified to several different forms, and the scope and spirit of the disclosure are not limited to the following embodiments. Rather, these embodiments make the disclosure thorough and complete, and are provided in order to completely transfer the technical spirit of the disclosure to those skilled in the art.

It is to be understood that technologies mentioned in the disclosure are not limited to specific embodiments, but include all modifications, equivalents, and/or substitutions according to embodiments of the disclosure. Throughout the accompanying drawings, similar components will be denoted by similar reference numerals.

Expressions "first", "second", and the like, used in the disclosure may indicate various components regardless of a sequence and/or importance of the components, will be used only in order to distinguish one component from the other components, and do not limit the corresponding components.

In the disclosure, an expression "A or B", "at least one of A and/or B", "one or more of A and/or B", or the like, may include all possible combinations of items listed together. For example, "A or B", "at least one of A and B", or "at least one of A or B" may indicate all of 1) a case in which at least one A is included, 2) a case in which at least one B is included, or 3) a case in which both of at least one A and at least one B are included.

In the disclosure, the singular expression includes the plural expression unless the context clearly indicates otherwise. It should be further understood that the term "include" or "constituted" used in the application specifies the presence of features, numerals, steps, operations, components, parts mentioned in the specification, or combinations thereof, but do not preclude the presence or addition of one or more other features, numerals, steps, operations, components, parts, or combinations thereof.

When it is mentioned that any component (for example, a first component) is (operatively or communicatively) connected with/to or is connected to another component (for example, a second component), it is to be understood that any component is directly connected with/to another component or may be connected with/to another component through the other component (for example, a third component). On the other hand, when it is mentioned that any component (for example, a first component) is "directly connected with/to" or "directly connected to" to another component (for example, a second component), it is to be understood that the other component (for example, a third component) is not present between any component and another component.

An expression "configured (or set) to" used in the disclosure may be replaced by an expression "suitable for", "having the capacity to", "designed to", "adapted to", "made to", or "capable of" depending on a situation. A term "configured (or set) to" may not necessarily mean only "specifically designed to" in hardware. Instead, in any context, an expression "a device configured to" may mean that the device is "capable of" together with other devices or components. For example, a "processor configured (or set) to perform A, B, and C" may mean a dedicated processor (for example, an embedded processor) for performing the corresponding operations or a generic-purpose processor (for example, a central processing unit (CPU) or an application processor) that may perform the corresponding operations by executing one or more software programs stored in a memory device.

Hereinafter, embodiments of the disclosure will be described in detail with reference to the accompanying drawings so that those skilled in the art to which the disclosure pertains may easily practice the disclosure.

FIG. 1 is a view for describing a display module according to an embodiment of the disclosure.

Referring to FIG. 1, a display module 1 may include a plurality of pixels 100-1, 100-2, . . . , 100-n (n is a natural number). In this case, the display module 1 may visually display an image (e.g., photo, video, and the like) or information (e.g., letters, numbers, symbols, and the like) through the plurality of pixels 100-1, 100-2, . . . , 100-n.

Here, each of the plurality of pixels 100-1, 100-2, . . . , 100-n may be a minimum unit constituting a screen (region) in which the image or the information is displayed on the display module 1, and may appear as a point having independent color or brightness.

Meanwhile, because the plurality of pixels 100-1, 100-2, . . . , 100-n have different positions from each other, but have the same structure and function as each other, a description of one pixel 100-1 may be applied to the other pixel 100-2, . . . , 100-n in the same way unless otherwise specified. Hereinafter, the pixel 100-1 will be described for convenience of description.

The pixel 100-1 may be formed of a combination of a plurality of sub-pixels (e.g., red, green, blue sub-pixels, and the like). That is, one pixel 100-1 may be configured by a combination of colors of a plurality of sub-pixels positioned in regions adjacent to each other. According to an embodiment, the pixel 100-1 or the sub-pixel may be implemented as a semiconductor element (e.g., a light emitting diode (LED) 50 (see FIG. 2)) that emits light. As such, the plurality of pixels 100-1, 100-2, . . . , 100-n may be implemented as a plurality of semiconductor elements (e.g., a plurality of LEDs 50). More specific details will be described later.

The plurality of pixels 100-1, 100-2, . . . 100-n may be arranged spaced apart from each other at intervals therebetween. According to an embodiment, the intervals are predetermined. According to an embodiment, the intervals are regular intervals. That is, the plurality of pixels 100-1 and 100-2 may be arranged in a matrix type (e.g., M×N, where M and N are each a natural number).

Meanwhile, the display module 1 may be implemented as a display device by itself (i.e., a single display module 1), or a plurality of display modules may be combined to be implemented as a single display device. For example, the plurality of display modules may be tiled in a matrix type (e.g., Q×W, where Q and W are each a natural number) to configure a single display device.

The display device may refer to a device capable of visually displaying an image by processing an image signal received from an external device or an image signal stored in a storage through an image processor, or visually displaying information processed by a processor. According to an embodiment, the processor may be a hardware processor. According to an embodiment, the display device may be implemented in various forms such as a TV, a monitor, a portable multimedia device, a portable communication device, a smart phone, a smart glass, a smart window, a smart watch, a head mounted display (HMD), a wearable device, a portable device, a handheld device, a signage, an electronic scoreboard, a billboard, a cinema screen, a video wall, and the form thereof is not limited.

That is, the display module 1 according to an embodiment of the disclosure may be installed and applied to a wearable device, a portable device, a handheld device, and an electronic product (i.e., a small display device) or an electronic device that requires various displays in a single unit, and the display module 1 may be applied to an electronic product (i.e., a large display device) or an electronic device such as monitor, a high-definition TV, a signage (or a digital signage), and an electronic scoreboard through an assembly arrangement of a matrix type in a plurality of units. Further, the display module 1 according to an embodiment of the disclosure may also be applied to a transparent display device such as a smart window or a smart glass.

Hereinafter, the display module 1 according to an embodiment of the disclosure will be described in more detail with reference to the accompanying drawings.

FIGS. 2, 3, 4A and 4B are views for describing in more detail the display module 1 according to an embodiment of the disclosure. FIGS. 2, 3, 4A and 4B illustrate cross-sectional views of the display module 1 for one unit LED 50.

Figure 2:
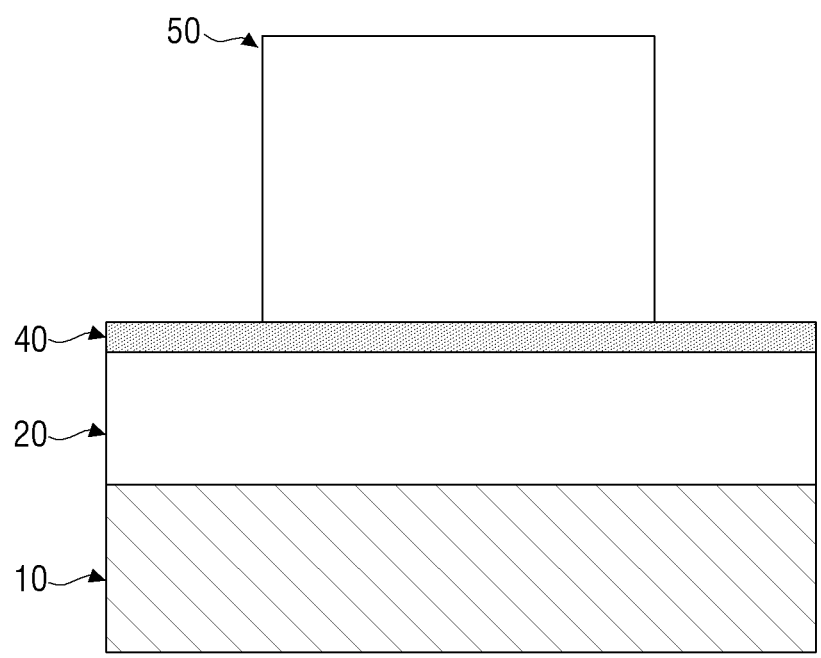
FIG. 2 is a view for describing a display module according to an embodiment of the disclosure.

Referring to FIG. 2, the display module 1 according to an embodiment of the disclosure may include a substrate 10, a driving circuit layer 20, an intermediate substrate 40, and an LED 50.

The substrate 10 may support and protect various electronic elements such as the driving circuit layer 20 and the LED 50. In addition, the substrate 10 may have transparent properties, rigid properties or flexible properties. According to an embodiment, the substrate 10 may be implemented with various materials such as glass, polyimide (PI), polyethylene terephthalate (PET), polyethylene naphthalate (PEN), polyvinyl chloride (PVC), and poly methyl methacrylate (PMMA).

The driving circuit layer 20 may be provided on the substrate 10. The driving circuit layer 20 may be electrically connected to the LED 50 and may allow the LED to emit light 50 by applying power (e.g., voltage or current) to the LED 50. That is, the driving circuit layer 20 may control the power to drive the LED 50. Here, the power may be applied in various forms such as an alternating current (AC), a direct current (DC), a square wave, and a triangular wave. Meanwhile, the driving circuit layer 20 may be configured as various circuits according to a method (e.g., DC driving, AC driving, pulse width modulation (PWM) driving, or the like) of controlling the driving of the LED 50.

Figure 3:
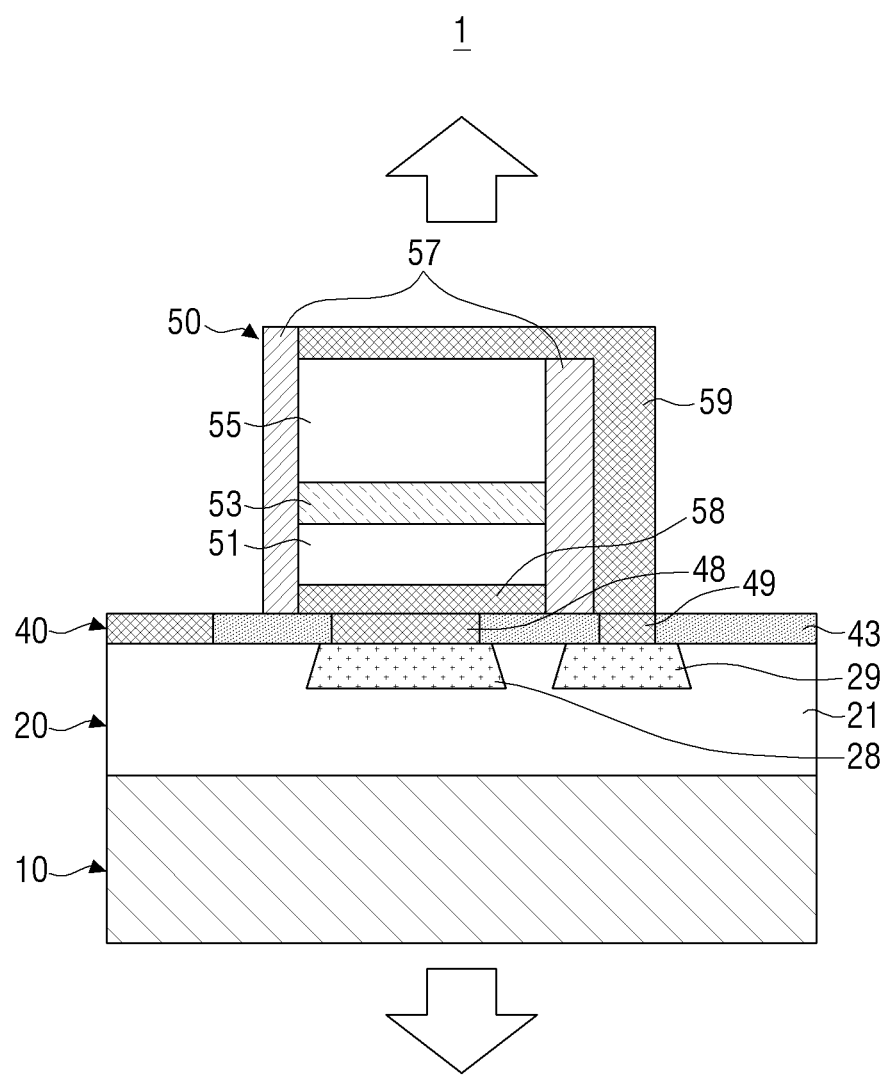
FIG. 3 is a view for describing in more detail a display module according to an embodiment of the disclosure.

As an example, referring to FIG. 3, the driving circuit layer 20 may include a pixel circuit 21 and a plurality of electrodes 28 and 29.

The pixel circuit 21 may drive the LED 50 so that the LED 50 emits light. According to an embodiment, the LED 50 is mounted (or bonded) on the pixel circuit 21, so that the LED 50 and the pixel circuit 21 may be electrically connected to each other. At this time, the LED 50 may constitute sub-pixels (e.g., red, green, and blue) of the display module 1. That is, the pixel circuit 21 may be formed for the LED 50 corresponding to one of the red (R) sub-pixel, the green (G) sub-pixel, and the blue (B) sub-pixel.

According to an embodiment, the pixel circuit 21 may include a switching element, a capacitor, a metal wire, an insulator, and the like. Here, the switching device may be implemented as an amorphous silicon (A-Si) based TFT, a low-temperature polycrystalline silicon (LTPS) based TFT, or the like. The TFT (or backplane) may include a gate, a source, and a drain, and when a voltage is applied to the gate, a channel is formed, and a current flows from the source to the drain, which causes a current (or voltage) to be transmitted to the LED 50 so that the LED 50 connected to the pixel circuit 21 emits light. Here, the TFT is not limited to a specific structure or type. That is, the TFT may be implemented as a low-temperature polycrystalline silicon (LTPS) TFT, an oxide TFT, a poly silicon TFT, an amorphous silicon (a-silicon) TFT, an organic TFT, a graphene TFT, or the like, and may be implemented in various types such as a P type (or N-type) MOSFET formed in a Si wafer CMOS process.

The plurality of electrodes 28 and 29 of the driving circuit layer 20 may include a first electrode 28 and a second electrode 29. Here, the first electrode 28 may be one of an anode and a cathode, and the second electrode 29 may be one of the anode and the cathode that is different from the first electrode 28. For instance, according to an embodiment, the first electrode 28 may be an anode and the second electrode 29 may be a cathode. According to another embodiment, the first electrode 28 may be a cathode and the second electrode 29 may be ab anode.

The plurality of electrodes 28 and 29 of the driving circuit layer 20 may be electrically connected to the pixel circuit 21. That is, the first electrode 28 and the second electrode 29 may be electrically connected to the pixel circuit 21 by ohmic contact with the pixel circuit 21. In this case, the pixel circuit 21 may be electrically connected to the LED 50 through the first electrode 28 and the second electrode 29. For example, the pixel circuit 21 may be electrically connected to a first type semiconductor layer 51 of the LED 50 through the first electrode 28, and a first conductive portion 48 and 58 of the intermediate substrate 40. The pixel circuit 21 may be electrically connected to a second type semiconductor layer 55 of the LED 50 through the second electrode 29, a second conductive portion 49 of the intermediate substrate 40, and an upper electrode 59 of the LED 50.

Each of the plurality of electrodes 28 and 29 of the driving circuit layer 20 may be implemented with a material having various properties such as transparent properties and flexible properties, in addition to electrical conductivity. For example, each of the plurality of electrodes 28 and 29 may be implemented in the form comprising at least one of Al, Ti, Ni, Pd, Ag, Au, Au—Ge, indium-tin-oxide (ITO), or ZnO.

The intermediate substrate 40 may be attached on the driving circuit layer 20. In addition, in this case, a lower portion of the LED 50 may be bonded (or attached) onto an upper portion of the intermediate substrate 40, and an upper portion of the driving circuit layer 20 may be bonded (or attached) onto a lower portion of the intermediate substrate 40. That is, the intermediate substrate 40 may be attached onto the driving circuit layer 20 in a state in which a plurality of LEDs 50 are bonded onto the intermediate substrate 40. Accordingly, the driving circuit layer 20 may be electrically connected to the LED 50 through the intermediate substrate 40.

Here, the intermediate substrate 40 may be a prepreg (preimpregnated material). At this time, the prepreg may be a generic term for a material mixed-molded by impregnating a resin with a fiber material (e.g., fiber, fabric). Because the prepreg may precisely control a ratio of the resin to the fiber material (e.g., mainly carbon fiber material) and may increase a volume ratio of the fiber material, the prepreg has an advantage of improving various properties such as strength, stiffness, corrosion resistance, fatigue life, wear resistance, impact resistance, weight reduction, reliability, and elasticity compared to other materials. In addition, when the prepreg is formed in the form of a sheet, there is an advantage that the prepreg may be easily cut and used to a desired size.

As an example, referring to FIG. 3, the intermediate substrate 40 (e.g., prepreg) may include an adhesive portion 43, a first conductive portion 48 and 58, and a second conductive portion 49. The intermediate substrate 40 may be attached onto the driving circuit layer 20 through the adhesive portion 43. Specifically, the adhesive portion 43 may be made of a resin or the like, and may have a tack, and the intermediate substrate 40 may be attached onto the driving circuit layer 20 by the tack of the adhesive portion 43.

Here, the adhesive portion 43 (or the adhesive material) may include at least one of epoxy, polyimide, or phenol. Accordingly, a surface of the intermediate substrate (e.g., prepreg) 40 may have the tack.

The driving circuit layer 20 may be electrically connected to the plurality of LEDs 50 through the first conductive portion 48 and 58, and the second conductive portion 49. At this time, the first conductive portion 48 and 58 (or first conductive material), and the second conductive portion 49 (or second conductive material) may be implemented with a fiber material having electrical conductivity of a predetermined value or more. In addition, in this case, the plurality of LEDs 50 may be attached onto the intermediate substrate 40 by the first conductive portion 48 and 58. Specifically, the plurality of LEDs 50 may be attached onto the intermediate substrate 40 by the van der Waals force of the first conductive portion 48 and 58. At this time, the van der Waals force is a force acting on neutral molecules, and the closer the distance between the molecules (between the molecules of the LED 50 and the first conductive portion 48 and 58) is, the stronger the strength of the force may be.

According to an embodiment, each of the first and second conductive portions 48, 49, and 58 may include at least one of carbon nanotube (CNT), graphene, or metal nano wire.

Here, the CNT may refer to an allotrope of carbon in which carbon atoms have a cylindrical or spiral structure. The CNT may have different optical transparency and electrical properties (e.g., electrical conductivity, electrical resistance, and the like) according to a structure of CNT (e.g., single wall CNT (SW-CNT), multi wall CNT (MW-CNT), and the like), a diameter of CNT, a molecular length of CNT, a concentration (or density) of CNT, and a density of hybrid material (e.g., Ag nano wire, TiOx, and the like). Accordingly, the CNT may be used as a black matrix with high resistance, or may also be used as a transparent electrode with high electrical conductivity.

The graphene may refer to an allotrope of carbon in which carbon atoms are connected in a hexagonal honeycomb shape to form a two-dimensional planar structure. The graphene may be classified into single-layer graphene or multi-layer graphene according to the number of layers, and optical transparency and electrical properties may vary depending on the number of layers of graphene.

The metal nano wire may refer to a wire structure having a size in nanometers. The metal nano wire is in the form of a wire having a diameter between several nanometers and hundreds of nanometers, and may include at least one material among Ag, TiOx, Ni, Pt, Au, Si, InP, GaN, or ZnO.

Meanwhile, the composition or structure of the above-described intermediate substrate 40 (e.g., prepreg) is only an example, and may be variously modified and carried out.

The LED 50 may be provided on the intermediate substrate 40. In this case, each of the plurality of LEDs 50 may be electrically connected to the driving circuit layer 20 through the intermediate substrate 40, and may emit light according to the power applied from the driving circuit layer 20.

Here, the LED 50 may refer to a semiconductor light emitting element. For example, the LED 50 may be implemented as an inorganic semiconductor-based micro-LED element or mini-LED device. Here, the micro-LED may refer to a semiconductor light emitting element having a width, a length, and a height of 1 to 100 micrometers (μm), respectively, and the mini-LED may refer to a semiconductor light emitting element having a width, a length, and a height of 100 to 200 micrometers (μm), respectively. However, this is only an example, and as long as it is a light-emitting element that meets the object of the disclosure, the type thereof is not particularly limited.

As an example, referring to FIG. 3, each of the plurality of LEDs 50 may include a first type semiconductor layer 51, a second type semiconductor layer 55, and a light emitting layer 53.

The first type semiconductor layer 51 may be one of an n-type semiconductor and a p-type semiconductor, and the second type semiconductor layer 55 may be one different from the first type semiconductor layer 51 of the n-type semiconductor and the p-type semiconductor.

Here, the n-type semiconductor may refer to a semiconductor in which free electrons are used as carriers for transferring charges, and the p-type semiconductor may refer to a semiconductor in which holes are used as carriers for transferring charge. According to an embodiment, the n-type semiconductor and the p-type semiconductor may be implemented as compound semiconductors such as group III-V and group II-VI. In particular, the n-type semiconductor and the p-type semiconductor may be implemented as a nitride semiconductor layer. For example, each of the n-type semiconductor and the p-type semiconductor may be n-GaN and p-GaN. However, the n-type semiconductor and the p-type semiconductor according to the disclosure are not limited thereto, and may be made of various materials according to various characteristics required for the display module 1.

The first type semiconductor layer 51 and the second type semiconductor layer 55 may be provided on each of upper and lower portions of the light emitting layer 53. For example, the first type semiconductor layer 51 may be provided on the lower portion of the light emitting layer 53, and the second type semiconductor layer 55 may be provided on the upper portion of the light emitting layer 53.

In the first type semiconductor layer 51, the intermediate substrate 40 may be bonded onto the driving circuit layer 20. That is, the first type semiconductor layer 51 may be electrically connected to the first electrode 28 of the driving circuit layer 20 through the first conductive portion 48 and 58 of the intermediate substrate 40, as the intermediate substrate 40 is attached to the driving circuit layer 20.

Specifically, the lower portion of the LED 50, that is, the first type semiconductor layer 51 may make ohmic contact with the first conductive portion 48 and 58 of the intermediate substrate 40. That is, the first type semiconductor layer 51 may be electrically connected to the driving circuit layer 20 through the first conductive portion 48 and 58 of the intermediate substrate 40. That is, the first conductive portion 48 and 58 of the intermediate substrate 40 may have a function of electrical connection with the lower electrode of the LED and the driving circuit layer 20.

The second type semiconductor layer 55 may be electrically connected to the second electrode 29 of the driving circuit layer 20 after the intermediate substrate 40 is attached to the driving circuit layer 20. The method of electrical connecting may be different according to the structure of the LED 50. For instance the method of electrical connecting may be a vertical structure, a flip-chip structure, and the like, according to the structure of the LED 50.

As an example, in the case of the vertical structure, each of the plurality of LEDs 50 may further include an upper electrode 59. At this time, the upper electrode 59 may function as an electrode (or pad) and wiring.

Here, the upper electrode 59 may be provided on the second type semiconductor layer 55 after the intermediate substrate 40 is attached to the driving circuit layer 20. At this time, the upper electrode 59 may be provided along an upper portion of the second type semiconductor layer 55 and a side surface of the LED 50.

In this case, the second type semiconductor layer 55 may be electrically connected to the driving circuit layer 20 through the upper electrodes 59 of the plurality of LEDs 50. For example, the second type semiconductor layer 55 may be electrically connected to the second electrode 29 of the driving circuit layer 20 through the upper electrode 59 and the second conductive portion 49 of the intermediate substrate 40. That is, the upper electrode 59 may have a function of electrical connection between the second type semiconductor layer 55 of the LED 50 and the second electrode 29 of the driving circuit layer 20.

The light emitting layer 53 may be provided between the first type semiconductor layer 51 and the second type semiconductor layer 55 by a semiconductor junction.

Specifically, the light emitting layer 53 may be provided in a single-quantum well structure (SQW), a multi-quantum well structure (MQW), or a quantum dot (QD) structure at an interface between the n-type semiconductor and the p-type semiconductor by junction of the n-type semiconductor and the p-type semiconductor. Here, when the light emitting layer 53 is formed in the multi-quantum well structure, a well layer/barrier layer of the light emitting layer 53 may be formed in a structure such as InGaN/GaN, InGaN/InGaN, GaAs(InGaAs)/AlGaAs, but the disclosure is not limited to such a structure. In addition, the number of quantum wells included in the light emitting layer 53 is also not limited to a specific number.

In this case, when a current is applied to the first type semiconductor layer 51 and the second type semiconductor layer 55 in a forward bias (e.g., in the case of a p-n junction connecting a cathode to the n-type semiconductor and an anode to the p-type semiconductor), the light emitting layer 53 may generate excitons as electrons of the n-type semiconductor layer and holes of the p-type semiconductor layer recombine in the light emitting layer (e.g., quantum well layer), and may emit light because an energy state of the excitons is shifted. At this time, a wavelength of the emitted light may correspond to an energy bandgap of the light emitting layer 53, and the energy band gap may be determined by its structure, such as the composition and film thickness of a semiconductor forming the quantum well (QW) layer.

Meanwhile, the first type semiconductor layer 51 or the second type semiconductor layer 55 according to the disclosure may further include various semiconductor layers.

As an example, the first type semiconductor layer 51 may further include a semiconductor layer (a p+ type or n+ type semiconductor layer) doped with a stronger dopant concentration than a general semiconductor layer (the p-type semiconductor layer or the n-type semiconductor layer), a semiconductor layer (a p-type semiconductor layer or an n-type semiconductor layer) doped with a weaker dopant concentration than the general semiconductor layer (the p-type semiconductor layer or the n-type semiconductor layer). Furthermore, the first type semiconductor layer 51 may further include an undoped semiconductor layer (e.g., u-GaN or the like). The same description may also be applied to the second type semiconductor layer 55.

In addition, as an example, the first type semiconductor layer 51 may further include an electron blocking layer (EBL) or a hole blocking layer (HBL). The electron blocking layer (EBL) may prevent electrons to be moved to the light emitting layer 53 from being lost, and for this purpose, may be formed at a position adjacent to the light emitting layer 53. The hole blocking layer (HBL) may prevent holes to be moved to the light emitting layer 53 from being lost, and may be formed at a position adjacent to the light emitting layer 53. The same description may also be applied to the second type semiconductor layer 55.

Figure 4A:
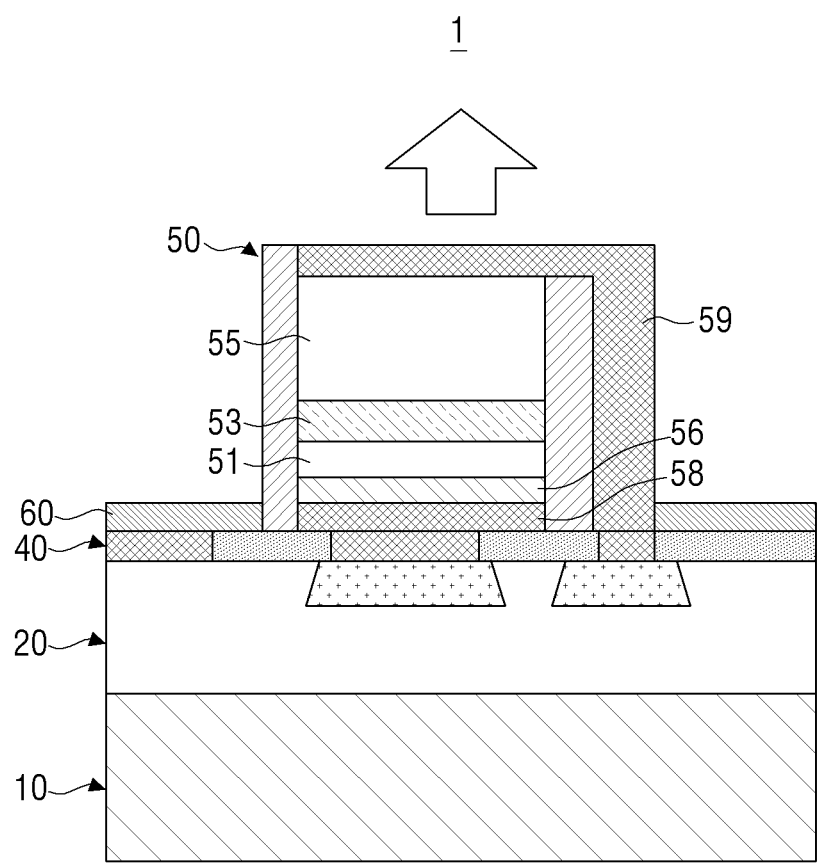
FIG. 4A is a view for describing in more detail a display module according to an embodiment of the disclosure.
Figure 4B:
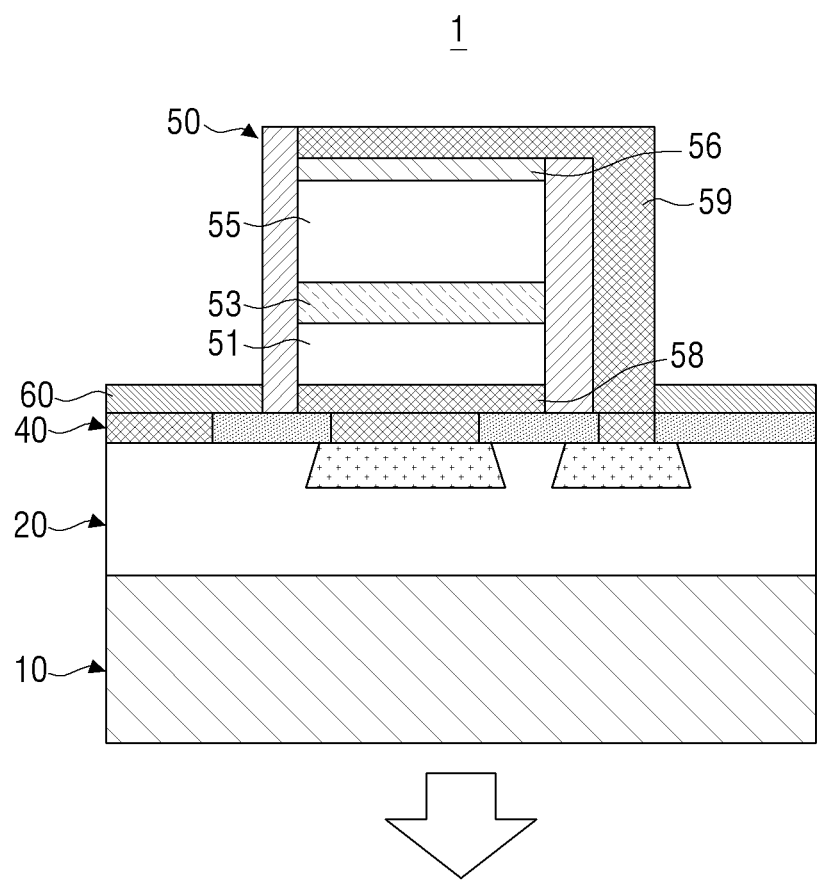
FIG. 4B is a view for describing in more detail a display module according to an embodiment of the disclosure.

According to an embodiment, the LED 50 may be an LED having a vertical structure. For example, each of the plurality of LEDs 50 may have a structure in which one electrode (e.g., a lower electrode) is formed at the bottom, and one electrode (e.g., an upper electrode) is formed at the top. That is, as illustrated in FIGS. 3, 4A and 4B of the disclosure, the LED 50 may be characterized by a structure for forming the upper electrode and the lower electrode.

In particular, the display module 1 according to an embodiment of the disclosure may have a stepless bottom contact structure, unlike a flip chip structure that requires protrusions (bumps or pads (electrodes)) between the driving circuit layer 20 and the LED 50 to electrically connect the driving circuit layer 20 and the LED 50. According to an embodiment, in the flip chip structure, two pads may be provided on the lower portion of each of the first and second type semiconductor layers 51 and 55 of the LED 50, and the two pads provided on the lower portion of the LED 50 and the two electrodes provided on the upper portion of the driving circuit layer 20 may be electrically connected to each other through the bumps located therebetween. The flip chip structure is a structure in which an area of the first type semiconductor layer 51 is smaller than an area of the second type semiconductor layer 55 based on a horizontal plane, and an area of the light emitting layer 53 provided on the interface between the first type semiconductor layer 51 and the second type semiconductor layer 55 is also smaller than the area of the second type semiconductor layer 55.

According to an embodiment, the display module 1 having the stepless bottom contact structure does not need to form the protrusions such as the pads and bumps by placing a step on each of the lower surfaces of the first and second type semiconductor layers 51 and 55 of the LED 50 in that the display module 1 having the stepless bottom contact structure may electrically connect the driving circuit layer 20 and the LED 50 through the intermediate substrate 40. That is, the intermediate substrate 40 may replace the protrusions such as the pads and bumps.

Accordingly, the display module 1 having the stepless bottom contact structure may maximize the areas of the first type semiconductor layer 51 and the second type semiconductor layer 55, and as a result, a light emitting area of the light emitting layer 53 provided between the first type semiconductor layer 51 and the second type semiconductor layer 55 may be maximized to improve light emission efficiency.

In addition, the display module 1 having the stepless bottom contact structure may prevent the risk of short circuit occurrence of the two electrodes in that the two electrodes (or pads) of the LED 50 are formed at different positions, such as the upper and lower portions of the LED 50. In particular, when the LED 50 is miniaturized, compared to the flip chip structure in which the two electrodes are positioned on the lower portion of the LED 50, the stepless bottom contact structure in which the two electrodes are positioned on the upper and lower portions of the LED 50 may effectively prevent the risk of short circuit occurrence.

In addition, the LED 50 applied to the display module 1 according to the disclosure is in the form of a package between a related art surface mount device (SMD) and a chip size package (CSP), and may maintain the advantages of size and cost, respectively, and at the same time solve an issue of Mura caused by light leakage in the related art light emitting element. In addition, the structure of the display module 1 according to the disclosure may improve light emission efficiency and yield in a manufacturing process.

Meanwhile, referring to FIG. 3, the display module 1 according to an embodiment of the disclosure may further include a passivation element 57.

The passivation element 57 may be provided on sidewalls of the LED 50. For example, the passivation element 57 may be provided on sidewalls of the first type semiconductor layer 51, the light emitting layer 53, and the second type semiconductor layer 55. Meanwhile, the upper electrode 59 may be formed along the passivation element 57.

In this case, the passivation element 57 may perform functions for improving light emission efficiency of the light emitting layer 53 and protecting the semiconductor layers and the light emitting layer 53 from the outside, such as an insulating layer and impurities. According to an embodiment, the passivation element 57 may be implemented with various insulating materials such as $Al_2O_3$, SiN, and $SiO_2$. However, this is only an example, and the material of the passivation element 57 is not limited to a specific material.

Meanwhile, according to an embodiment of the disclosure, referring to FIGS. 3, 4A and 4B, an emission direction of the LED 50 may be one of a top side, a bottom side, and a both side. Here, the top side, the bottom side, and the both side may refer to directions that proceed to the outside of the LED 50, as illustrated by arrow directions illustrated in FIGS. 3, 4A, 4B. The emission direction may be determined according to a position of the reflective electrode 56 (see FIGS. 4A and 4B) and permeability (or transparency) of the material provided on the upper and lower portions of the LED 50.

Referring to FIG. 3, the emission direction of the LED 50 according to an embodiment of the disclosure may be the both side (or a double-sided light emission). In this case, the reflective layer is not inserted (included) inside the LED 50, and light emitted from the light emitting layer 53 of the LED 50 may proceed in the top side and the bottom side of the display module 1. Here, when the emission direction is the both side, it is possible to display an image on a front surface (top side) and a rear surface (bottom side) of the display module 1.

In this case, each of the upper electrode 59, the first and second conductive portions 48, 49, and 58, the driving circuit layer 20 (comprising the first and second electrodes 28 and 29 of the driving circuit layer 20), and the substrate 10 may be made of a material that contributes to the permeability as a permeable material, that is, a material (e.g., glass, ITO, metal nano thin film, graphene, or the like) having high permeability and no light emission absorption.

Here, the upper electrode 59 included in the LED 50 may be implemented as a transparent electrode. Accordingly, light traveling in the top side is not blocked by the transparent electrode, and may transmit through the transparent electrode. At this time, the transparent electrode may refer to an electrode having excellent electrical characteristics while transmitting light through high optical transparency. For example, the transparent electrode may refer to an electrode having optical characteristics of transmittance of 80% or more in a visible light region comprising blue, green, and red (e.g., light having a wavelength in the range of 450 nm to 680 nm), and electrical characteristics of low sheet resistance ($\Omega$/sq) of hundreds or less and high conductivity (S/m) of hundreds or more.

Here, the transparent electrode may include at least one of carbon nano tube (CNT), graphene, or metal nano wire, and may also be implemented with various materials such as indium tin oxide (ITO), conductive polymer (e.g., Pedot:pss, or the like), Au, Pt, $SnO_2$, and $TiO_2$, which have high light transmittance and electrical conductivity. In addition, the transparent electrode may be implemented with a film material having flexibility.

The transparent electrode may include CNT formed to have high electrical conductivity and transparent properties according to a structure of CNT (e.g., single wall CNT (SW-CNT), multi wall CNT (MW-CNT), and the like), a diameter of CNT, a molecular length of CNT, a concentration (or density) of CNT, and a density of hybrid material (e.g., Ag nano wire and the like).

Here, the first and second conductive portions 48, 49, and 58 may include at least one of carbon nano tube (CNT), graphene, or metal nano wire having transparent properties.

In this case, the transparent electrode may be formed of the same material as the first and second conductive portions 48, 49, and 58 of the intermediate substrate 40.

Referring to FIGS. 4A and 4B, the LED 50 according to an embodiment of the disclosure may further include a reflective electrode 56. In this case, the reflective electrode 56 serves to adjust a traveling direction of the light emitted from the LED 50.

As an example, referring to FIG. 4A, the emission direction of the LED 50 may be the top side (or a front light emission). In this case, the reflective layer is inserted (included) inside the LED 50, and the light emitted from the light emitting layer 53 of the LED 50 may proceed in the top side of the display module 1.

Here, the reflective electrode 56 may be provided on the lower portion of the first type semiconductor layer 51 as illustrated in FIG. 4A. In this case, the first type semiconductor layer 51 may be electrically connected to the driving circuit layer 20 through the reflective electrode 56 and the first conductive portion 48 and 58 of the intermediate substrate 40. A method of forming the reflective electrode 56 will be described later in a process of FIG. 6B.

Specifically, the reflective electrode 56 may reflect light in a direction different from a traveling direction of light emitted from the light emitting layer 53 and incident on the reflective electrode 56. For example, when the reflective electrode 56 is provided on the lower portion of the first type semiconductor layer 51, the reflective electrode 56 may reflect light from an upper surface of the reflective electrode 56 when light emitted in the bottom side from the light emitting layer 53 reaches the reflective electrode 56. At this time, the direction of the reflected light may be the top side of the light emitting layer 53.

According to an embodiment, the reflective electrode 56 may be provided in a structure of a metal reflector or a distributed-bragg-reflector (DBR). In addition, the reflective electrode 56 may be made of a material such as aluminum (Al) or the like.

For example, the distributed-bragg-reflector structure may be implemented as a multilayer structure in which two layers having different refractive indices are alternately stacked. Accordingly, Fresnel reflection occurs at an interface of each layer due to a difference in different refractive indexes of the two layers, and depending on a material contained in the multilayer structure and a thickness thereof, all reflected waves may cause constructive interference.

In this case, in order not to block the light traveling in the top side, the upper electrode 59 may be implemented as a material having high permeability and no light emission absorption. That is, the upper electrode 59 may be implemented as a transparent electrode, which will be omitted in that it overlaps with the description described above. Meanwhile, each of the first and second conductive portions 58, 48, and 49, the driving circuit layer 20 (comprising the first and second electrodes 28 and 29 of the driving circuit layer 20), and the substrate 10 may be implemented as an impermeable material in that it is unrelated to the traveling path of the light, but this is only an example and may also be implemented as a permeable material.

As another example, referring to FIG. 4B, the emission direction of the LED 50 may be the bottom side (or a rear light emission). In this case, the reflective layer is inserted (included) inside the LED 50, and the light emitted from the light emitting layer 53 of the LED 50 may travel in the bottom side of the display module 1.

Here, the reflective electrode 56 may be provided on the upper portion of the second type semiconductor layer 55 as illustrated in FIG. 4B. In this case, the second type semiconductor layer 55 may be electrically connected to the second electrode 29 of the driving circuit layer 20 through the reflective electrode 56, the upper electrode 59, and the conductive material 49 of the intermediate substrate 40.

For example, when the reflective electrode 56 is provided on the upper portion of the second type semiconductor layer 55, the reflective electrode 56 may reflect light from a lower surface of the reflective electrode 56 when light emitted in the top side from the light emitting layer 53 reaches the reflective electrode 56. At this time, the direction of the reflected light may be the bottom side of the light emitting layer 53.

In this case, each of the first and second conductive portions 48, 49, and 58, the driving circuit layer 20 (comprising the first and second electrodes 28 and 29 of the driving circuit layer 20), and the substrate 10 may be made of a material that contributes to the permeability as a permeable material, that is, a material (e.g., glass, ITO, metal nano thin film, graphene, or the like) having high permeability and no light emission absorption. On the other hand, the upper electrode 59 may be implemented as an impermeable material in that it is unrelated to the traveling path of the light, but this is only an example and may also be implemented as a permeable material.

Meanwhile, referring to FIGS. 4A and 4B, the display module 1 may further include a black matrix 60.

The black matrix 60 may be provided on the intermediate substrate 40 in a region between the plurality of LEDs 50.

That is, the black matrix 60 may be provided on the intermediate substrate 40 in a region between an LED 50-1 and another LED 50-2.

The black matrix 60 may include a material that absorbs light and exhibits a black color. In addition, the black matrix 60 may include a material having high resistance properties (or insulating properties). According to an embodiment, the black matrix 60 may include various materials such as CNT, polymer, and metal oxide.

In particular, the black matrix 60 may include CNT formed to have low electrical conductivity and light absorption properties according to a structure of CNT (e.g., single wall CNT (SW-CNT), multi wall CNT (MW-CNT), and the like), a diameter of CNT, a molecular length of CNT, a concentration (or density) of CNT, and a density of hybrid material (e.g., Ag nano wire and the like).

According to an embodiment of the disclosure as described above, there are advantages that the cost is reduced and the reliability is improved by simplifying the process and solving the reduction in yield, in that in order to connect the LED and the driving circuit layer, the electrode (e.g., the lower electrode) is provided on the lower portion of the LED, and there is no need to perform a process requiring heat treatment such as anisotropic conductive film (ACF) or bump soldering.

In addition, the display module 1 according to the disclosure is a stepless bottom bonding μ-LED structure, which has advantages that a separate pad/bump is unnecessary on the lower portion of the LED for connection, the driving circuit layer 20 and the LED 50 are directly bonded, and the ACF having a molding function is unnecessary as a stepless structure.

In addition, there is an advantage in that the intermediate substrate 40 on the lower portion of the LED 50 may simultaneously serve as an ohmic contact and a binder. Due to these advantages, a contact area between the circuit board and the LED element may be widened, and accordingly, a heat dissipation effect may be improved.

In addition, in the display module 1 according to the disclosure, the LED 50 may be easily transferred (or attached) to the driving circuit layer 20 using the intermediate substrate 40.

Here, when the intermediate substrate 40 to which the LED 50 is attached is attached to the driving circuit layer 20 (or the TFT layer), one or a plurality of LEDs 50 may be attached. At this time, the LEDs 50 of the same color (or the same sub-pixel) may be simultaneously transferred in line units (e.g., column units or row units) or other aggregation units. In addition, when the LEDs 50 of the R, G, and B sub-pixels are arranged and attached on the intermediate substrate 40, a unit pixel or a plurality of pixels may be simultaneously transferred to the driving circuit layer 20.

Accordingly, the display module 1 and the manufacturing method thereof according to the disclosure may improve the overall production yield while improving a transfer speed for the LEDs 50.

Figure 5:
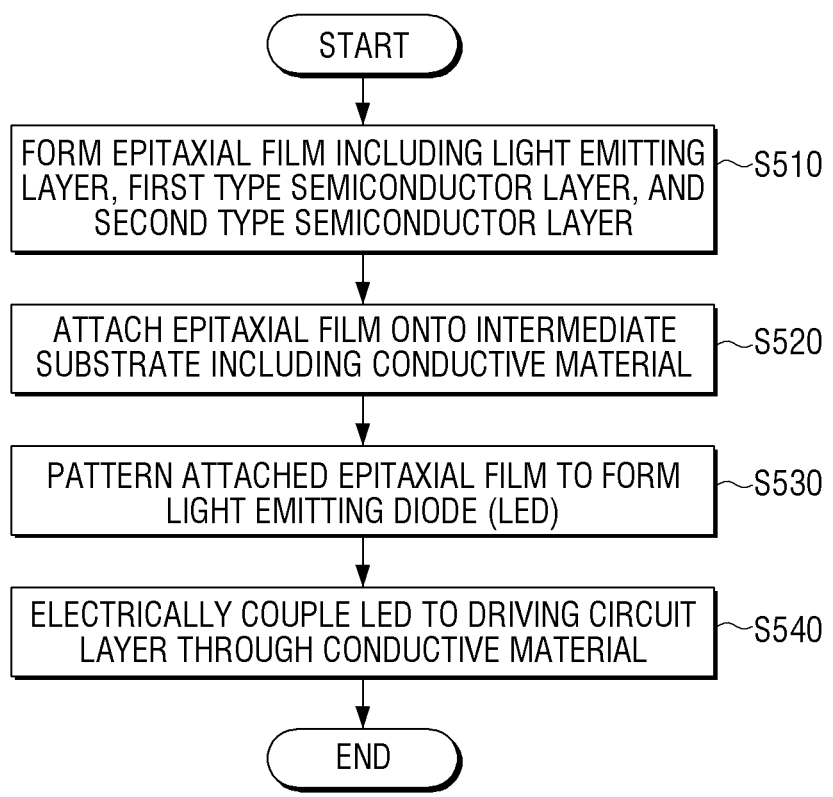
FIG. 5 is a flowchart for describing a method for manufacturing a display module according to an embodiment of the disclosure.

FIG. 5 is a flowchart for describing a method for manufacturing a display module according to an embodiment of the disclosure.

Referring to FIG. 5, a manufacturing method of a display module 1 may include an operation (S510) of forming an epitaxial film comprising a light emitting layer, a first type semiconductor layer, and a second type semiconductor layer, an operation (S520) of attaching the epitaxial film to an intermediate substrate 40 comprising a conductive material, an operation (S530) of patterning the attached epitaxial film to form a light emitting diode (LED) 50, and an operation (S540) of electrically connecting the LED 50 to a driving circuit layer 20 through the conductive material.

Hereinafter, each operation of the manufacturing method of the display module according to the disclosure will be described together with reference to the accompanying drawings.

Figure 6A:
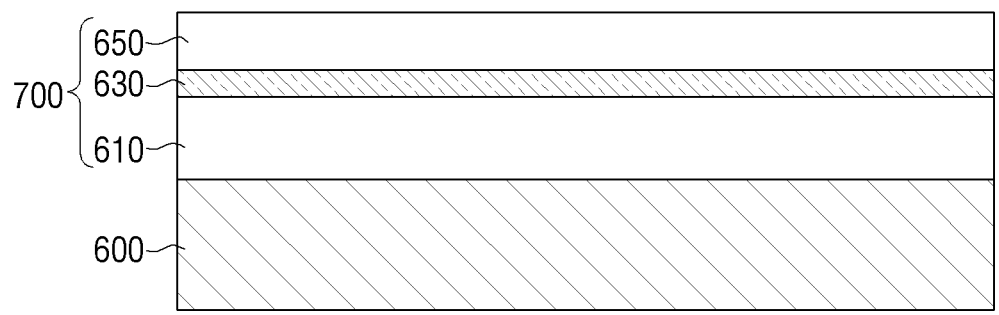
FIG. 6A is a view for describing an operation of forming an epitaxial film according to an embodiment of the disclosure.
Figure 6B:
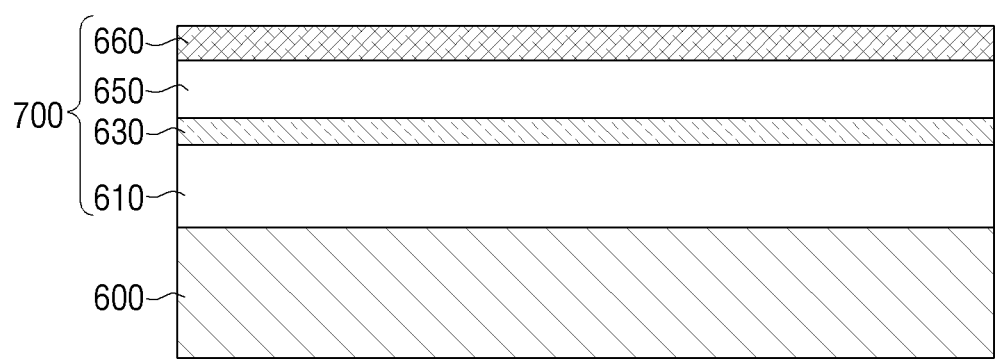
FIG. 6B is a view for describing the operation of forming the epitaxial film according to an embodiment of the disclosure.

FIGS. 6A and 6B are views for describing an operation of forming an epitaxial film according to an embodiment of the disclosure.

According to an embodiment, in operation (S510), an epitaxial film 700 may be formed on a growth substrate 600. According to an embodiment, the epitaxial film 700 may include a first type semiconductor layer 610, a light emitting layer 630, and a second type semiconductor layer 650. Accordingly, the first type semiconductor layer 610, the light emitting layer 630, and the second type semiconductor layer 650 may be formed on a growth substrate 600 (S510).

Here, the growth substrate 600 may be a material or wafer suitable for growth (epitaxy) of a semiconductor. For example, the growth substrate 600 may be implemented with a material such as silicon (Si), sapphire ($Al_2SO_4$), SiC, GaN, GaAs, or ZnO. On the other hand, the growth substrate 600 may be used as a substrate for epitaxial growth of the first type semiconductor layer 610, the light emitting layer 630, and the second type semiconductor layer 650, and then separated and removed therefrom.

When the growth substrate 600 is provided, the first type semiconductor layer 610, the light emitting layer 630, and the second type semiconductor layer 650 may be sequentially formed on the growth substrate 600. According to an example embodiment, when the growth substrate 600 is provided, the first type semiconductor layer 610, the light emitting layer 630, and the second type semiconductor layer 650 may be sequentially grown on the growth substrate 600. At this time, the description of the first type semiconductor layer 51, the light emitting layer 53, and the second type semiconductor layer 55 of the LED 50 described in FIG. 3 may be applied to each of the first type semiconductor layer 610, the light emitting layer 630, and the second type semiconductor layer 650 in the same way, and thus the overlapping contents will be omitted.

According to an embodiment, the growth of the semiconductor layer may be achieved by utilizing process technologies such as metalorganic vapor phase epitaxy (MOVPE), metal organic chemical vapor deposition (MOCVD), molecular beam epitaxy (MBE), liquid phase epitaxy (LPE), and vapor phase epitaxy (VPE).

Here, the epitaxial film 700 may include the first type semiconductor layer 610, the light emitting layer 630, and the second type semiconductor layer 650, and may refer to a film implemented in the form of a thin film having a thickness (a height in a vertical direction) of several nanometers to tens of micrometers.

In addition, a size of the epitaxial film 700 (an area or a diagonal length on a plane having a height as a normal) may correspond to a size of the growth substrate 600. For example, the size of the epitaxial film 700 may be substantially the same as the size of the growth substrate 600 (e.g., a 10-inch wafer or the like), or may be smaller than the size of the growth substrate 600.

In addition, each of the first type semiconductor layer 610, the light emitting layer 630, and the second type semiconductor layer 650 may further include semiconductor layers having various properties, such as a hole blocking layer or an electron blocking layer, without limiting the technical spirit of the disclosure.

Meanwhile, an emission direction of the display module 1 manufactured according to the manufacturing method of the disclosure may be one of a top side, a bottom side, or both the top side and the bottom side.

The manufacturing method according to an embodiment of the disclosure may not form a reflective electrode. In this case, the emission direction of the display module 1 manufactured through the following operations may be both the top side and the bottom side.

According to another embodiment, a manufacturing method may include an operation of forming a reflective electrode. In this case, the emission direction of the display module 1 manufactured through the following operations may be one of the top side and the bottom side according to a position of an electrode.

For instance, according to an embodiment illustrated in FIG. 6B, the first type semiconductor layer 610, the light emitting layer 630, and the second type semiconductor layer 650 may be sequentially formed (grown) on the growth substrate 600, and a reflective electrode 660 may be then formed on the second type semiconductor layer 650. That is, when the reflective electrode 660 is formed in the state of FIG. 6A, the state of FIG. 6B may be obtained. In this case, the emission direction of the display module 1 manufactured through the following operations may be the top side.

At this time, the reflective electrode 660 may be formed on the second type semiconductor layer 650 through processes such as atomic layer deposition (ALD), e-beam evaporation, and sputtering. The reflective electrode 660 may be formed to have a thickness (a height in a vertical direction) of several nanometers to tens of micrometers.

Here, the reflective electrode 660 may be configured as a layer comprising a metal material (e.g., Al, Ag—Pd—Cu alloy, or the like). In addition, the reflective electrode 660 may be configured as a single layer or a plurality of layers. For example, the reflective electrode 660 may be configured as a multi-film layer of a loop-layer structure comprising a first reflective layer formed of aluminum, a second reflective layer formed on the first reflective layer and formed of aluminum nitride, and a third reflective layer formed on the second reflective layer and formed of aluminum.

Meanwhile, various metal materials having high reflectivity may be used for the reflective electrode 660 described above, but the material of the reflective electrode 660 is not limited to a specific material and may be implemented by being modified with various materials.

According to another example embodiment, a reflective electrode 660 may be formed on the substrate 600, and then the first type semiconductor layer 610, the light emitting layer 630, and the second type semiconductor layer 650 may be sequentially formed on the reflective electrode 660.

Figure 7A:
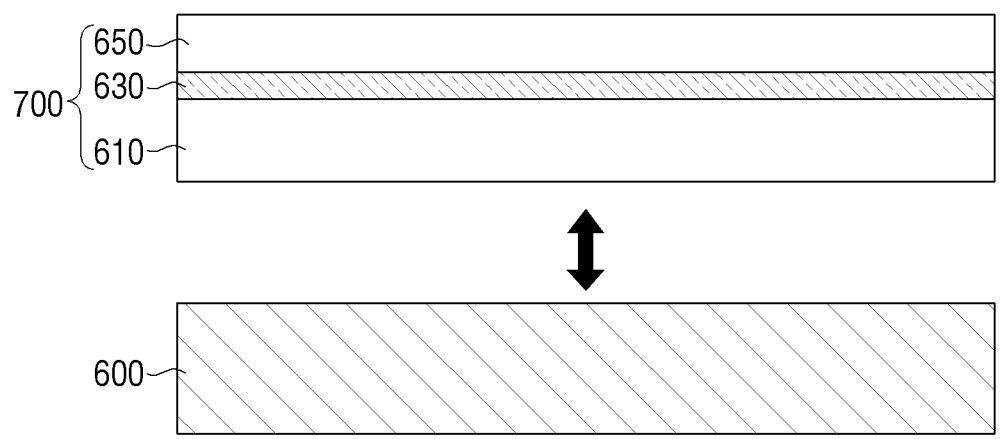
FIG. 7A is a view for describing an operation of forming an epitaxial film according to an embodiment of the disclosure.
Figure 7B:
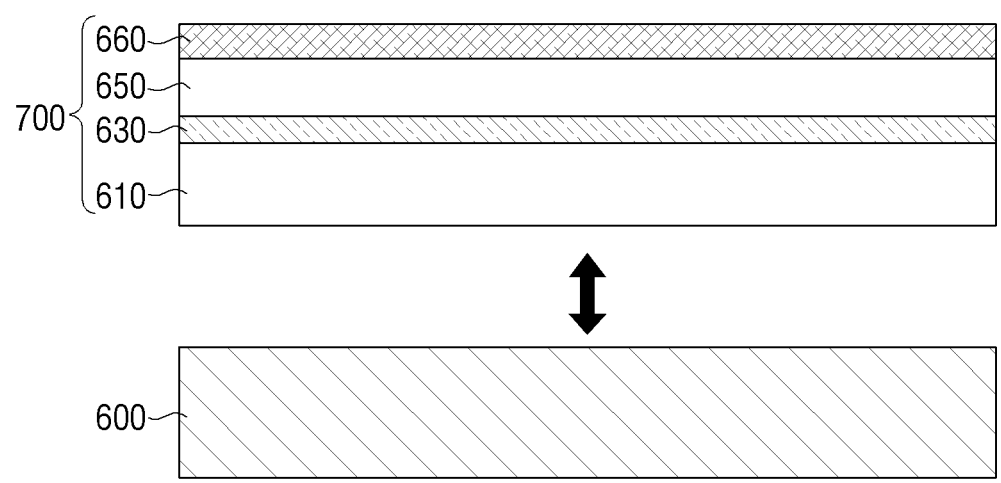
FIG. 7B is a view for describing an operation of forming an epitaxial film according to an embodiment of the disclosure.

FIGS. 7A and 7B are cross-section views for describing an operation of separating the epitaxial film according to an embodiment of the disclosure.

Referring to FIGS. 7A and 7B, the epitaxial film 700 may be separated from the growth substrate 600. Here, the epitaxial film 700 may include the first type semiconductor layer 610, the light emitting layer 630, and the second type semiconductor layer 650. According to an embodiment, the separation (removal) of the growth substrate 600 may be performed by various methods such as laser lift off (LLO), lift off, wet etching, and the like.

As an example, referring to FIG. 7A, the first type semiconductor layer 610, the light emitting layer 630, and the second type semiconductor layer 650 may be sequentially formed on the growth substrate 600, and the epitaxial film 700 comprising the first type semiconductor layer 610, the light emitting layer 630, and the second type semiconductor layer 650 may be separated from the growth substrate 600. That is, the epitaxial film 700 may be separated in the state as illustrated in FIG. 6A. In this case, when the reflective electrode is formed before the subsequent patterning operation, the emission direction may become the bottom side, and when the reflective electrode is not formed, the emission direction may become both side.

As another example, referring to FIG. 7B, the first type semiconductor layer 610, the light emitting layer 630, the second type semiconductor layer 650, and the reflective electrode 660 may be sequentially formed on the growth substrate 600, and the epitaxial film 700 comprising the first type semiconductor layer 610, the light emitting layer 630, the second type semiconductor layer 650, and the reflective electrode 660 may be separated from the growth substrate 600. That is, the epitaxial film 700 may be separated in the state as illustrated in FIG. 6B. In this case, the emission direction may become the top side.

Figure 8A:
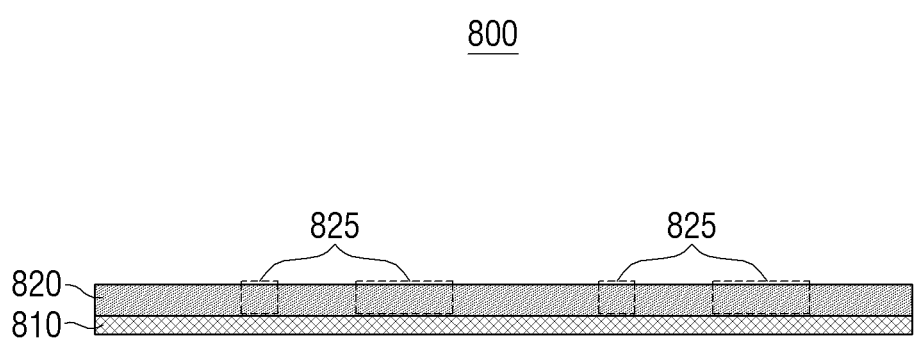
FIG. 8A is a view for describing an operation of forming an intermediate substrate according to an embodiment of the disclosure.
Figure 8B:
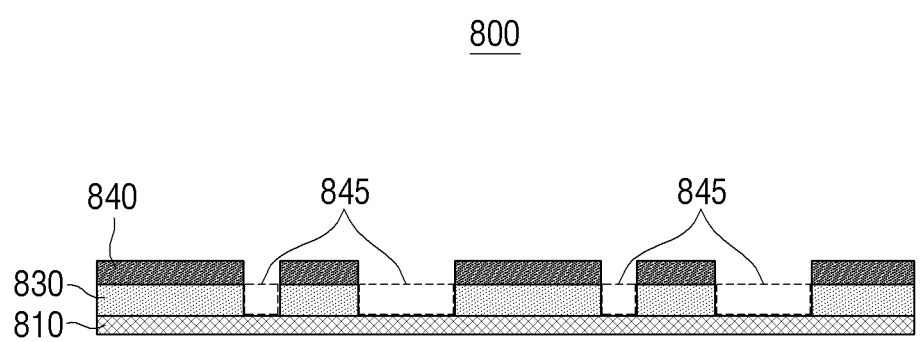
FIG. 8B is a view for describing an operation of forming an intermediate substrate according to an embodiment of the disclosure.
Figure 8C:
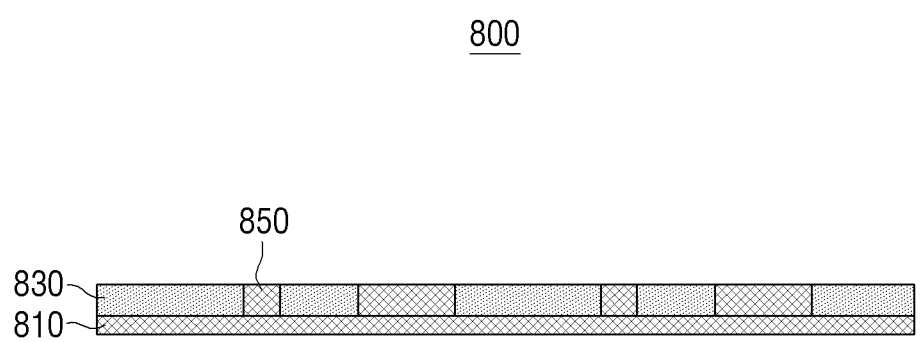
FIG. 8C is a view for describing an operation of forming an intermediate substrate according to an embodiment of the disclosure.

FIGS. 8A to 8C are views for describing an operation of forming an intermediate substrate according to an embodiment of the disclosure. Hereinafter, a method for manufacturing an intermediate substrate 800 will be first described, and then step S520 will be described.

Referring to FIG. 8A, the intermediate substrate 800 may be formed by impregnating a conductive material 810 with an adhesive material 820. That is, the intermediate substrate 800 may include the conductive material 810 and the adhesive material 820, and may be implemented as, for example, a prepreg containing the conductive material 810 and the adhesive material 820. Here, the description for the intermediate substrate 40, the conductive materials 48, 49, and 58, and the adhesive material 43 may be applied to each of the intermediate substrate 800, the conductive material 810, and the adhesive material 820 in the same way, and thus, the overlapping contents will be omitted.

Referring to FIGS. 8A and 8B, one or more regions 825 of the adhesive material 820 of the intermediate substrate 800 may be removed. Here, the removal of the adhesive material 820 formed in one or more regions 825 is to form a conductive material in the removed portion. The positions (or interval) of one or more regions 825 may correspond to the positions (or interval) of the electrodes of the driving circuit layer 20 so that the conductive material and the electrodes of the driving circuit layer 20 are electrically connected to each other.

At this time, in order to remove one or more regions 825 of the adhesive material 820, photolithography and etching processes may be used.

For example, an exposed region (or an unexposed region) may be removed depending on the type of photoresist (e.g., positive PR or negative PR) by forming a photoresist on the adhesive material 820 and exposing and then developing only a specific region of the photoresist formed on the adhesive material 820 through a mask having openings (or light transmission portions) formed therein.

In this case, as illustrated in FIG. 8A, in order to remove the adhesive material 820 formed in one or more regions 825, as illustrated in FIG. 8B, an ashing process (e.g., 02 gas, plasma surface treatment, organic film removal, or the like) may be performed on one or more regions 845 where a photoresist 840 does not remain.

In addition, referring to FIGS. 8B and 8C, in a state in which the photoresist 840 is formed on the adhesive material 830, a conductive material 850 may be formed in one or more regions 845 from which the adhesive material 820 is removed. At this time, the remaining photoresist 840 serves to prevent the conductive material from being formed on the adhesive material 830. Meanwhile, as a method of forming the conductive material 850, spray coating, MOCVD, MOVPE, MBE deposition, or the like may be used.

Thereafter, by removing the remaining photoresist 840, the intermediate substrate 800 may include a prepreg containing the conductive materials 810 and 850 and the adhesive material 830 as illustrated in FIG. 8C.

Meanwhile, the conductive materials 810 and 850 may include at least one of carbon nano tube (CNT), graphene, or metal nano wire, and the adhesive material 830 may include at least one of epoxy, polyimide, or phenol.

On the other hand, the above-described operation of forming the intermediate substrate 800 was described as being performed after the operation (S510) of forming the epitaxial film 700, but may also be performed prior to the operation (S510) of forming the epitaxial film 700 or simultaneously performed in parallel to the operation (S510) of forming the epitaxial film 700.

FIGS. 9A to 9D are views for describing an operation of bonding an epitaxial film onto an intermediate substrate according to an embodiment of the disclosure.

Figure 9A:
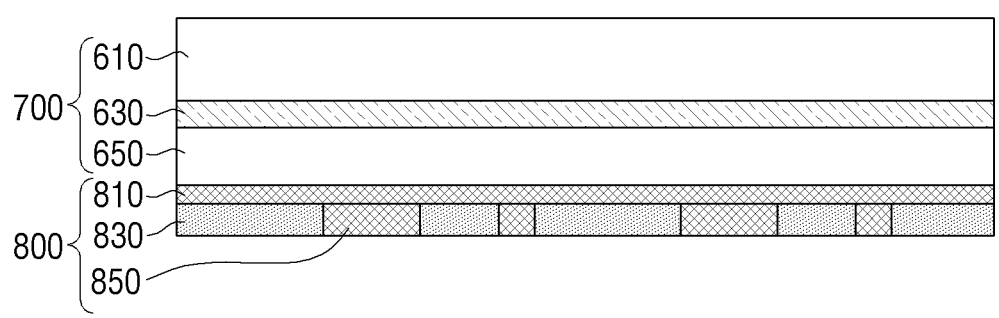
FIG. 9A is a view for describing an operation of bonding an epitaxial film onto an intermediate substrate according to an embodiment of the disclosure.
Figure 9B:
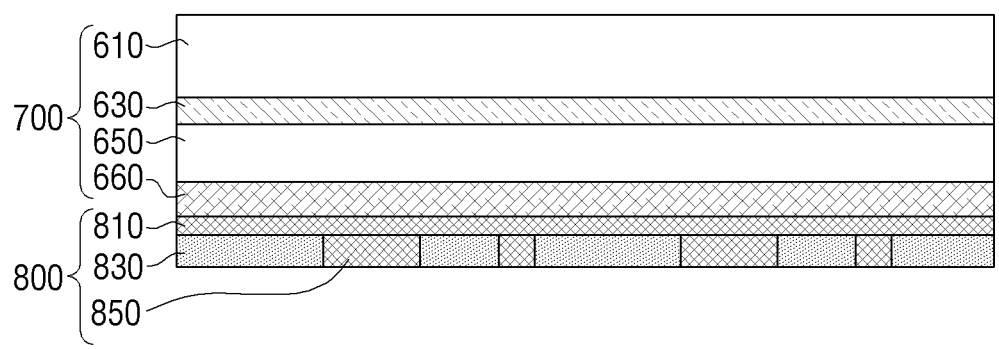
FIG. 9B is a view for describing an operation of bonding an epitaxial film onto an intermediate substrate according to an embodiment of the disclosure.

Referring to FIGS. 9A and 9B, the epitaxial film 700 may be attached (bonded) on to the intermediate substrate 800. At this time, the epitaxial film 700 may be directly-bonded onto the intermediate substrate 800 without other media (e.g., soldering bumps, ACF, and the like).

Specifically, the epitaxial film 700 separated from the growth substrate 600 may be attached (or bonded) onto the intermediate substrate 800. For example, one surface (e.g., the upper surface of the second type semiconductor layer 650 or the upper surface of the reflective electrode 660) of the epitaxial film 700 opposite to the surface (e.g., the lower surface of the first type semiconductor layer 610) separated from the growth substrate 600 may be attached (or bonded) onto the intermediate substrate 800. That is, the top and bottom of the epitaxial film 700 may be changed to directly bond onto the intermediate substrate 800.

Here, in the intermediate substrate 800, the conductive material 810 may be positioned on the upper portion thereof, and the adhesive material 830 may be positioned on the lower portion thereof. That is, the epitaxial film 700 may be attached to the intermediate substrate 800 so that the second type semiconductor layer 650 of the epitaxial film 700 abuts (faces) the conductive material 810 of the intermediate substrate 800.

At this time, the epitaxial film 700 may be attached onto the intermediate substrate 800 by the van der Waals force of the conductive material 810.

According to an embodiment, the epitaxial film 700 may be attached onto the intermediate substrate 800 through various methods such as reel to reel, roller pressing, vacuum pressing, and pressing in which a plate moves and presses in a vertical direction. For example, in the case of the roller pressing method, the epitaxial film 700 and the intermediate substrate 800 may be disposed in one direction. In this case, when the roller presses the epitaxial film 700 while rotating, the epitaxial film 700 may be attached onto the roller while being wound. When the roller presses the intermediate substrate 800 while rotating again, the epitaxial film 700 attached to the roller may be transferred to and attached onto the intermediate substrate 800.

Referring to FIGS. 7A and 9A, the epitaxial film 700 may be attached (or bonded) onto the intermediate substrate 800 so that the first type semiconductor layer 610 of the epitaxial film 700 in a state in which the reflective electrode is not formed is positioned on the upper portion thereof, and the second type semiconductor layer 650 opposite to the position of the first type semiconductor layer 610 of the epitaxial film 700 is positioned on the lower portion thereof. That is, the epitaxial film 700 may be attached (or bonded) onto the intermediate substrate 800 so that one surface of the second type semiconductor layer 650 of the epitaxial film 700 contacts the upper portion of the intermediate substrate 800.

Here, as an example, when the patterning operation (S530) is performed without forming the reflective electrode in the state of FIG. 9A, the emission direction may become both side. As another example, when the patterning operation (S530) is performed after forming the reflective electrode as illustrated in FIG. 9C in the state of FIG. 9A, the emission direction may become the bottom side.

Figure 9C:
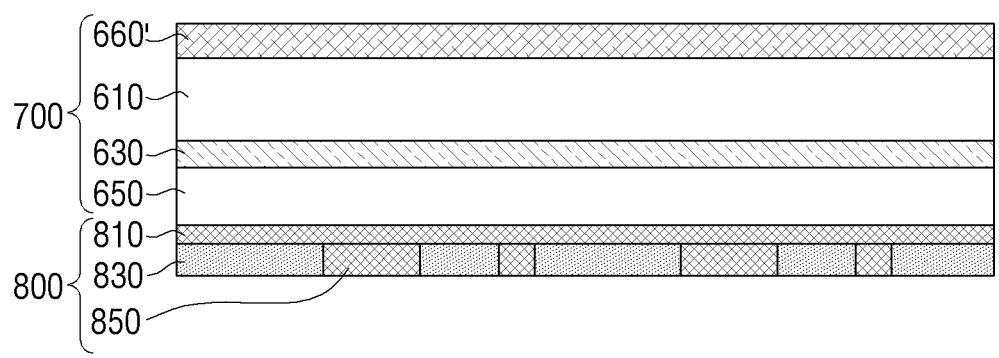
FIG. 9C is a view for describing an operation of bonding an epitaxial film onto an intermediate substrate according to an embodiment of the disclosure.
Figure 9D:
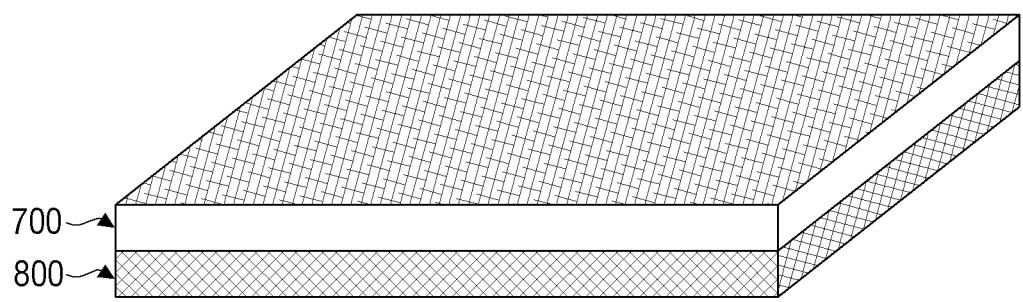
FIG. 9D is a view for describing an operation of bonding an epitaxial film onto an intermediate substrate according to an embodiment of the disclosure.

Specifically, referring FIG. 9C, after the epitaxial film 700 comprising the first type semiconductor layer 610, the light emitting layer 630, and the second type semiconductor layer 650 is attached (or bonded) onto the intermediate substrate 800, a reflective electrode 660' may be then formed on the upper portion of the first type semiconductor layer 610. At this time, the reflective electrode 660' may be formed on the first type semiconductor layer 610 through processes such as atomic layer deposition (ALD), e-beam evaporation, and sputtering. The contents of the reflective electrode 660 described above may be applied to the reflective electrode 660' in the same way, and thus, the overlapping contents will be omitted. In this case, because the reflective electrode 660' is formed on the upper portion of the epitaxial film 700, the emission direction may become the bottom side.

On the other hand, as another example, referring to FIGS. 7B and 9B, the epitaxial film 700 may be attached (or bonded) onto the intermediate substrate 800 so that the first type semiconductor layer 610 of the epitaxial film 700 in a state in which the reflective electrode is formed is positioned on the upper portion thereof, and the reflective electrode 660 opposite to the position of the first type semiconductor layer 610 of the epitaxial film 700 is positioned on the lower portion thereof. That is, the epitaxial film 700 may be attached (or bonded) onto the intermediate substrate 800 so that one surface of the reflective electrode 660 of the epitaxial film 700 contacts the upper portion of the intermediate substrate 800. In this case, because the reflective electrode 660 is formed on the lower portion of the epitaxial film 700, the emission direction may become the top side.

Figure 10A:
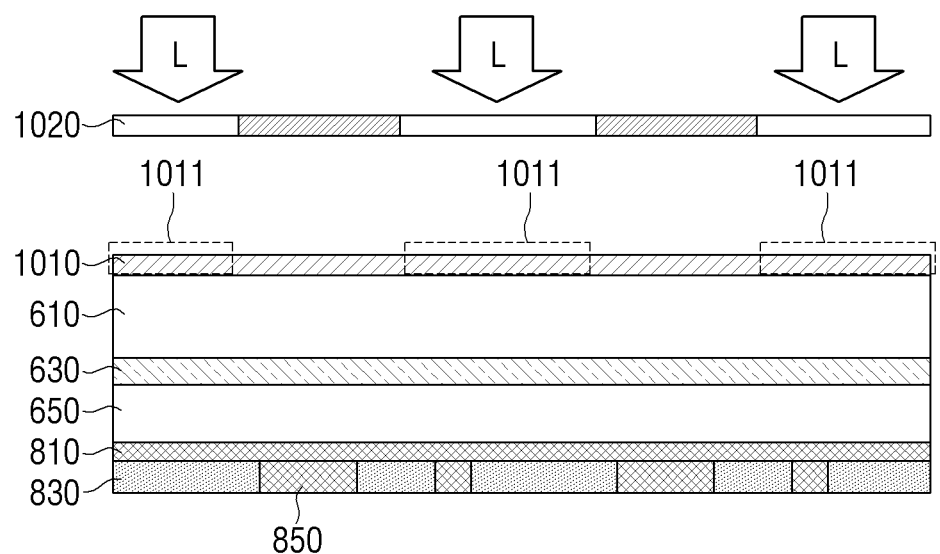
FIG. 10A is a view for describing a patterning operation according to an embodiment of the disclosure.
Figure 10B:
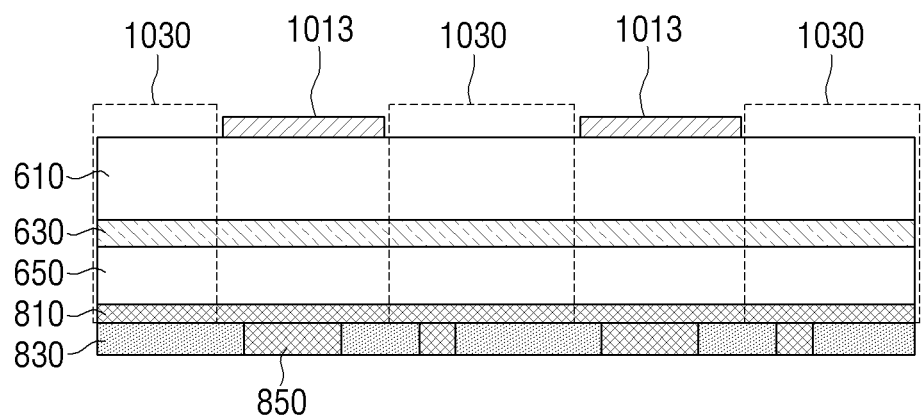
FIG. 10B is a view for describing a patterning operation according to an embodiment of the disclosure.
Figure 10C:
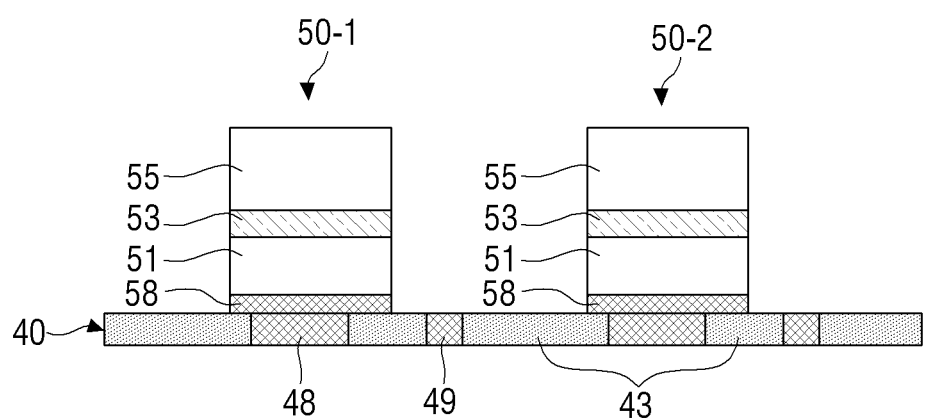
FIG. 10C is a view for describing a patterning operation according to an embodiment of the disclosure.
Figure 10D:
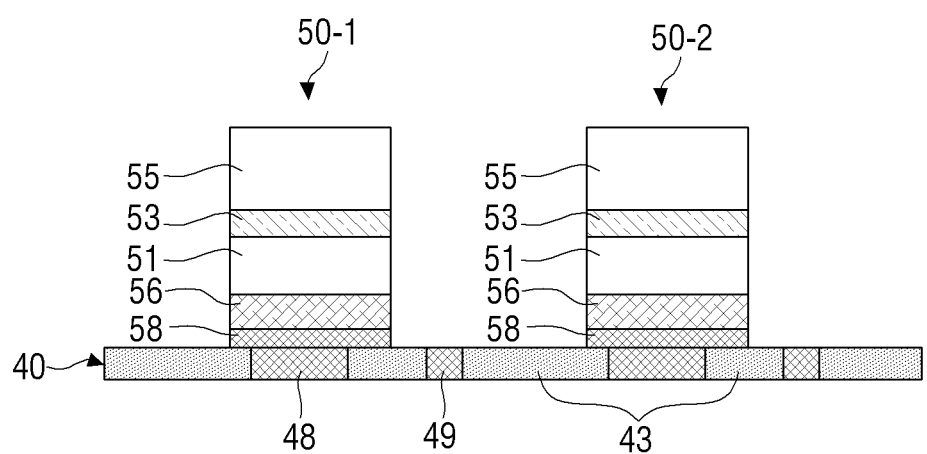
FIG. 10D is a view for describing a patterning operation according to an embodiment of the disclosure.
Figure 10E:
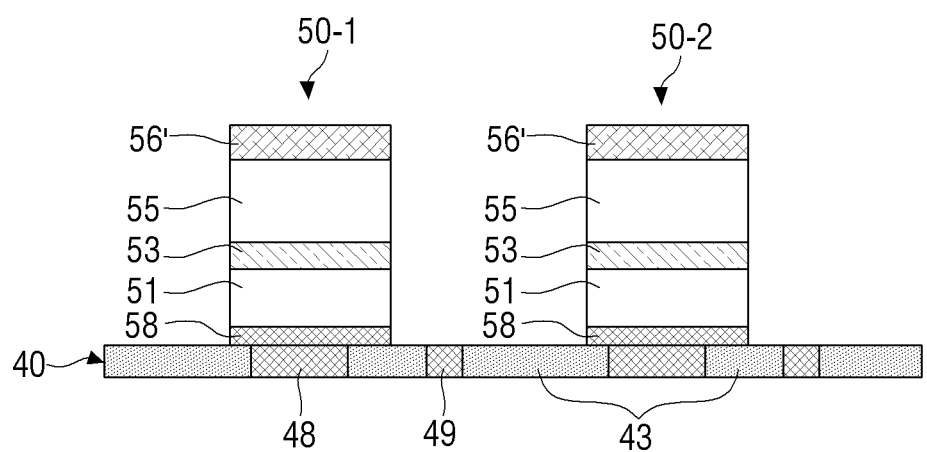
FIG. 10E is a view for describing a patterning operation according to an embodiment of the disclosure.

FIGS. 10A to 10F are views for describing an operation of patterning an epitaxial film according to an embodiment of the disclosure. Here, FIGS. 10A to 10C are views for describing an operation of patterning the epitaxial film 700 in a state in which the reflective electrode is not formed, as illustrated in FIG. 9A, and FIGS. 10D and 10E are views for describing a structure of the LED 50 generated as a result of patterning, as illustrated in FIGS. 10A and 10B, the epitaxial film 700 in a state in which the reflective electrodes 660 and 660' are formed as illustrated in FIGS. 9B and 9C, respectively.

Referring to FIG. 10A to 10F, the epitaxial film 700 attached onto the intermediate substrate 800 may be patterned to form a light emitting diode (LED) 50 (S530). At this time, the LED 50 formed as a result of the patterning may include a light emitting layer 53, and a first type semiconductor layer 51 and a second type semiconductor layer 55 formed on upper and lower portions of the light emitting layer 53, respectively. Here, the LED 50 may refer to one of the plurality of LEDs 50-1 and 50-2 as illustrated in FIGS. 10C-10E.

Specifically, referring to FIGS. 10A and 10B, the epitaxial film 700 bonded onto the intermediate substrate 800 may be patterned. At this time, a photolithography process and an etching process may be used.

For example, after a photoresist 1010 is formed on the first type semiconductor layer 610, a mask 1020 in which the openings (or the light transmission portions) are formed may be aligned on the photoresist 1010, and specific regions 1011 of the photoresist 1010 may be exposed through the openings of the mask 1020.

In this case, the photoresist 1010 may be developed to remove an exposed region (or an unexposed region) as illustrated in FIG. 10B, and an etching process may be performed on one or more regions 1030 in which the photoresist 1013 does not remain. As a result, one or more regions 1030 may be removed. At this time, as the etching process, methods such as a wet etching, a dry etching, plasma, a physical etching, and a chemical etching may be used. Here, one or more regions 1030 may be a grid-shaped region, and may include a conductive material 49 and may be a region excluding the conductive material 48.

Thereafter, by removing the remaining photoresist 1013, as illustrated in FIGS. 10C-10F, the epitaxial film 700 may be formed in the form in which the plurality of LEDs 50-1 and 50-2 are separated from each other. In this case, the first type semiconductor layers 51 of the LEDs 50-1 and 50-2 may be formed based on the second type semiconductor layer 650 of the epitaxial film 700, the light emitting layers 53 of the LEDs 50-1 and 50-2 may be formed based on the light emitting layer 630 of the epitaxial film 700, and a plurality of second type semiconductor layers 55 of the LEDs 50-1 and 50-2 may be formed based on the first type semiconductor layer 610 of the epitaxial film 700.

Figure 10F:
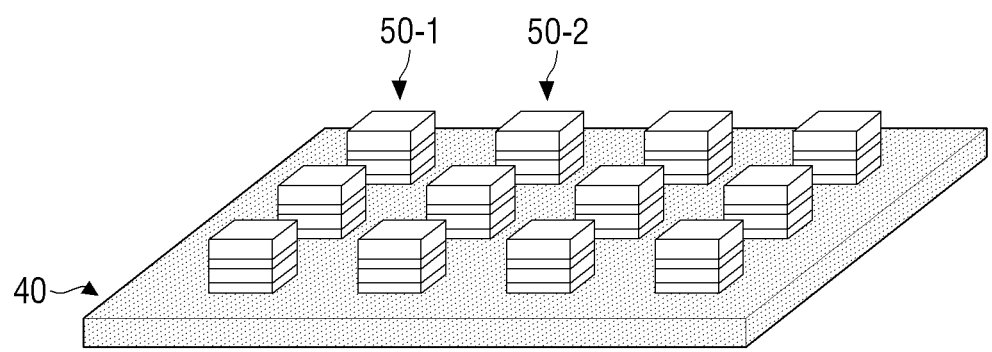
FIG. 10F is a view for describing a structure of a display module according to a patterning method according to an embodiment of the disclosure.

That is, the epitaxial film 700 attached (or bonded) onto the intermediate substrate 800 may be patterned as illustrated in FIGS. 10A and 10B to form the plurality of LEDs 50-1 and 50-2 on the intermediate substrate 40 as illustrated in FIGS. 10C and 10F.

In addition, a portion of the conductive material 810 formed on the intermediate substrate 40 may be removed, and a remaining portion of the conductive material 810 may remain. Here, the portions remaining in the intermediate substrate 40 as illustrated in FIG. 10C will be referred to as the conductive materials 58 and 48. In addition, the adhesive material 43 may remain in the intermediate substrate 40. That is, the intermediate substrate 40 that has been subjected to the patterning operation may include the conductive materials 48 and 58 and the adhesive material 43.

On the other hand, in the display module 1, according to the resolution, size, number of pixels, and the like, a pitch, which is an interval between the LEDs 50-1 and 50-2, may be designed (predetermined). Accordingly, the electrodes (e.g., the first electrode 28 and the like) of the driving circuit layer 20 to which the LEDs 50-1 and 50-2 are bonded may be disposed (formed) to be spaced apart from each other at an interval (e.g., an interval in an error range) corresponding to the predetermined pitch.

Here, because the intermediate substrate 40 applied to the display module 1 is implemented with a material having elasticity or stretch, the intermediate substrate 40 may be stretched in a direction in which a force is applied when a physical force is applied thereto. Accordingly, an interval between the conductive materials 48 of the intermediate substrate 40 (or an interval between the LEDs 50-1 and 50-2) may also be increased.

In the manufacturing method according to an embodiment of the disclosure, the LEDs 50-1 and 50-2 having an interval smaller than a predetermined pitch may be formed based on the epitaxial film 700 attached onto the intermediate substrate 40 by using elasticity or stretch of the intermediate substrate 40, and the physical force (e.g., tensile force) in a horizontal direction may be applied to the intermediate substrate 40 so that the interval between the LEDs 50-1 and 50-2 is the predetermined pitch.

Specifically, the conductive materials 48 of the intermediate substrate 40 may be formed to be spaced apart from each other at an interval (e.g., 40 um) smaller than the predetermined pitch (e.g., 50 um). In this case, after the epitaxial film 700 is attached onto the intermediate substrate 800, one region 1030 of the epitaxial film 700 and the intermediate substrate 800 may be removed through the patterning operation to form the mutually separated (individualized) LEDs 50-1 and 50-2. Here, the interval between the LEDs 50-1 and 50-2 may be an interval (e.g., 40 um) smaller than the predetermined pitch (e.g., 50 um), and may be the same value as a horizontal length of one region 1030 removed from the epitaxial film 700. Thereafter, a physical force (e.g., tensile force) in the horizontal direction may be applied to the intermediate substrate 40 so that the interval between the LEDs 50-1 and 50-2 is substantially the same interval (e.g., 50 um, comprising the error range) as the predetermined pitch.

According to an embodiment of the disclosure as described above, the size (area) of one region 1030 removed from the epitaxial film 700 may be smaller, and accordingly, a portion (area) discarded from the epitaxial film 700 grown through the growth substrate 600 (e.g., a wafer) having a limited size may be reduced, thereby improving an efficiency of resources, and the degree of integration of the LEDs 50-1 and 50-2 formed based on the epitaxial film 700 may be increased.

In addition, according to an embodiment of the disclosure, because the interval between the conductive materials 48 and between the LEDs 50-1 and 50-2 may be freely adjusted by using the elasticity or stretch of the intermediate substrate 40, process error such as error in the interval of the electrodes of the driving circuit layer may be solved, and display devices having various sizes or various pitches may be manufactured without having to build a separate production line for each size. For example, depending on the degree of tension force applied to the same 9.5-inch display module, it is possible to manufacture display devices of various sizes, such as a 10-inch display device and an 11-inch display device.

On the other hand, when the epitaxial film 700 in a state in which the reflective electrode is not formed as illustrated in FIG. 9A is patterned, the LEDs 50-1 and 50-2 that do not include the reflective electrode may be formed as illustrated in FIG. 10C. In this case, because each of the LEDs 50-1 and 50-2 does not include the reflective electrode, the emission direction may become both side.

On the other hand, when the patterning operation as illustrated in FIGS. 10A and 10B is performed for the epitaxial film 700 in the state in which the reflective electrode 660 is formed on the lower portion of the epitaxial film 700 as illustrated in FIG. 9B, the LEDs 50-1 and 50-2 having the reflective electrode 56 positioned on the lower portions thereof may be formed as illustrated in FIG. 10D. In this case, because each of the LEDs 50-1 and 50-2 includes the reflective electrode 56 formed on the lower portion thereof, the emission direction may become the top side.

On the other hand, when the patterning operation as illustrated in FIGS. 10A and 10B is performed for the epitaxial film 700 in the state in which the reflective electrode 660' is formed on the upper portion of the epitaxial film 700 as illustrated in FIG. 9C, the LEDs 50-1 and 50-2 having a reflective electrode 56' positioned on the upper portions thereof may be formed as illustrated in FIG. 10E. In this case, because each of the LEDs 50-1 and 50-2 includes the reflective electrode 56' formed on the upper portion thereof, the emission direction may become the bottom side.

Figure 11A:
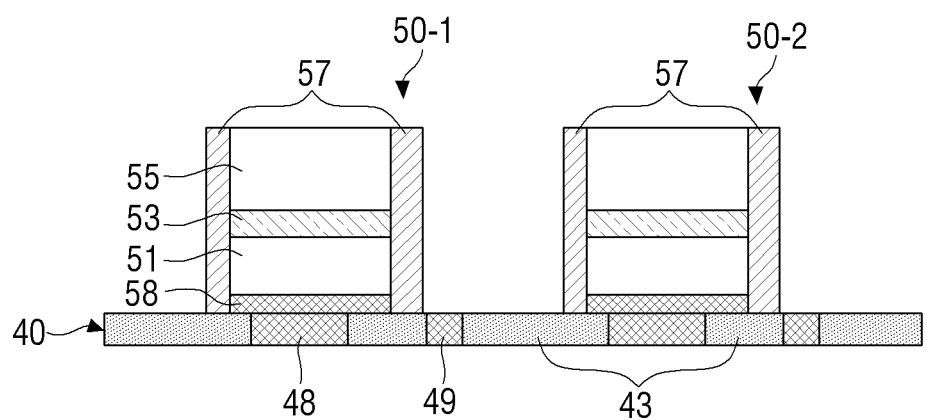
FIG. 11A is a view for describing an operation of forming a passivation element according to an embodiment of the disclosure.
Figure 11B:
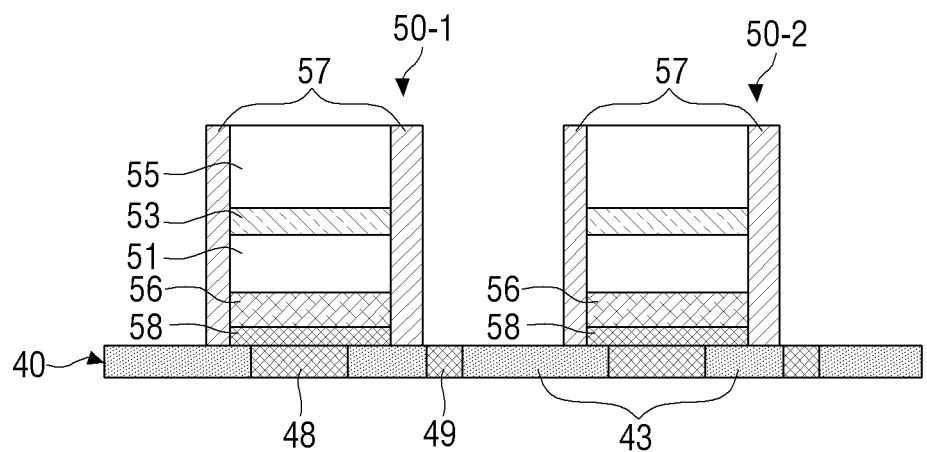
FIG. 11B is a view for describing an operation of forming a passivation element according to an embodiment of the disclosure.
Figure 11C:
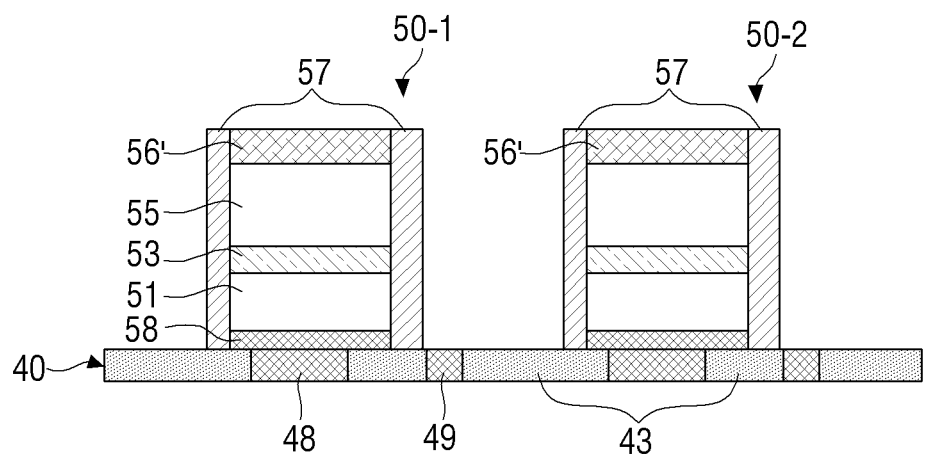
FIG. 11C is a view for describing an operation of forming a passivation element according to an embodiment of the disclosure.

FIGS. 11A to 11C are views for describing a method of forming a passivation according to an embodiment of the disclosure.

Referring to FIGS. 11A to 11C, the manufacturing method according to an embodiment of the disclosure may further include an operation of forming a passivation element 57 on sidewalls of the LEDs 50-1 and 50-2. According to an embodiment, the passivation element 57 may be formed by a deposition method such as atomic layer deposition, electron beam deposition, sputtering, or the like. The passivation 57 may include an insulating material, and the detailed content thereof will be omitted in that it overlaps with the content described above.

As an example, as illustrated in FIG. 11A, in the case of the LEDs 50-1 and 50-2 in which the reflective electrode is not formed, the passivation element 57 may be formed on the side walls of the LEDs 50-1 and 50-2. Specifically, the passivation element 57 may be formed to surround a sidewall (or a side surface) of each of the first type semiconductor layer 51, the light emitting layer 53, the second type semiconductor layer 55, and the conductive material 58 of the LED 50.

As another example, as illustrated in FIGS. 11B and 11C, in the case of the LEDs 50-1 and 50-2 in which the reflective electrodes 56 and 56' are formed, the passivation element 57 may be formed on the side walls of the LEDs 50-1 and 50-2. Specifically, the passivation element 57 may be formed to surround a sidewall (or a side surface) of each of the first type semiconductor layer 51, the light emitting layer 53, the second type semiconductor layer 55, the conductive material 58, and the reflective electrodes 56 and 56' of the LED 50.

Accordingly, since the passivation element 57 includes an insulating material, the light emission efficiency of the light emitting layer 53 may be improved, and the semiconductor layer and the light emitting layer 53 may be protected from the outside, such as an insulating layer and impurities.

Figure 12A:
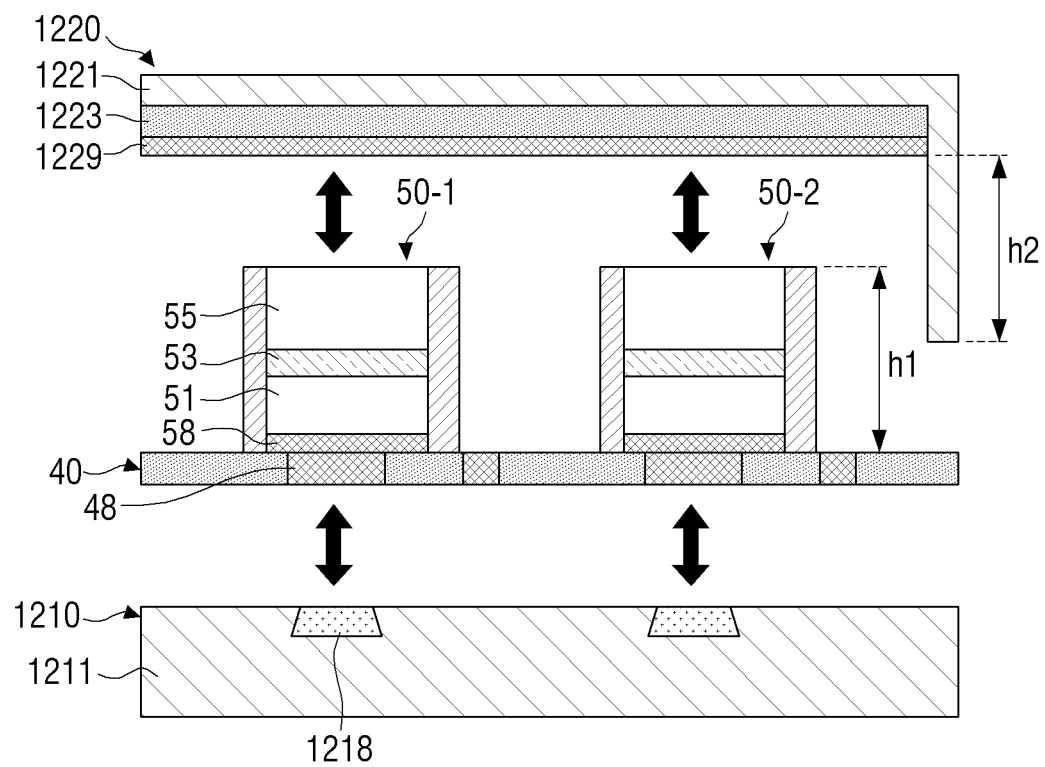
FIG. 12A is a view for describing an inspection method according to an embodiment of the disclosure.
Figure 12B:
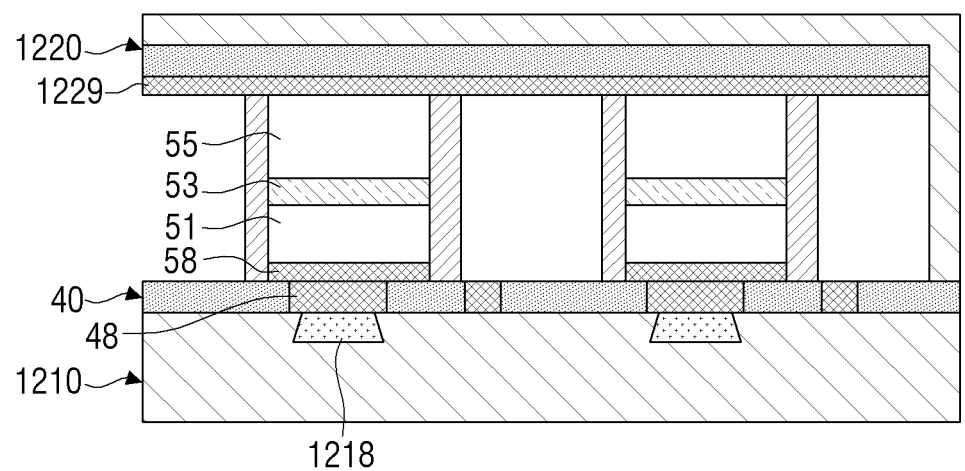
FIG. 12B is a view for describing an inspection method according to an embodiment of the disclosure.

FIGS. 12A and 12B are views for describing an inspection method according to an embodiment of the disclosure. FIGS. 12A and 12B illustrate the LEDs 50-1 and 50-2 in the state in which the reflective electrode is not formed, but this is for convenience of explanation only, and may also be applied to the LEDs 50-1 and 50-2 in the state in which the reflective electrodes 56 and 56' are formed in the same way.

In the manufacturing method according to an embodiment of the disclosure, before performing the operation (S540) of connecting the LED 50-1 and 50-2 to the driving circuit layer 20, an operation of inspecting defects of the plurality of LEDs 50-1 and 50-2 may be performed.

Referring to FIGS. 12A and 12B, lower and upper inspection substrates 1210 and 1220 may be attached to the upper and lower portions of the intermediate substrate 40 in a state in which the plurality of LEDs 50-1 and 50-2 are bonded.

Here, the inspection substrates 1210 and 1220 may be formed (or manufactured) as a structure for evaluating optical or electrical properties of each of the plurality of LEDs 50-1 and 50-2 bonded onto the intermediate substrate 40.

The lower inspection substrate 1210 may include a base substrate 1211 and a plurality of first electrodes 1218. Here, the plurality of first electrodes 1218 may be disposed in the same manner as the plurality of first electrodes 28 of the driving circuit layer 20 illustrated in FIG. 13, and may have the same polarity (e.g., anode or cathode).

The upper inspection substrate 1220 may include a base substrate 1221, an adhesive layer 1223, and a plurality of second electrodes 1229. Here, the plurality of second electrodes 1229 may be disposed in the same manner as the plurality of second electrodes 29 of the driving circuit layer 20 illustrated in FIG. 13, and may have the same polarity (e.g., anode or cathode). Here, the second electrode 1229 may be formed along a line in which the plurality of LEDs 50 are formed so as to be connected to the plurality of LEDs 50. In addition, a height h2 from a lower surface of the base substrate 1221 to lower surfaces of the plurality of second electrodes 1229 may be the same as a height h1 of the LED 50-1. This is because when h2 is smaller than h1, the upper inspection substrate 1220 may press the plurality of LEDs 50-1 and 50-2 and destroy the plurality of LEDs 50-1 and 50-2. Accordingly, the height h2 from the lower surface of the base substrate 1221 to the lower surfaces of the plurality of second electrodes 1229 may be adjustable according to the heights h1 of various LEDs 50-1.

In this case, as illustrated in FIG. 12B, the inspection substrates 1210 and 1220 may generate driving signals for turning on the plurality of LEDs 50-1 and 50-2, and accordingly, an optical inspection or the like of checking whether or not the plurality of LEDs 50-1 and 50-2 are defective may be performed.

Specifically, the optical inspection can identify whether or not the plurality of LEDs 50-1 and 50-2 are turned on through an image captured by a vision camera such as automatic optical inspection (AOI).

In particular, when it is identified that an LED which is not turned on (hereinafter, a defective LED) occurs because an interval between the plurality of first electrodes 1218 of the lower inspection substrate 1210 is larger than the interval between the conductive materials 48, the intermediate substrate 40 may be stretched such that the interval between the conductive materials 48 of the intermediate substrate 40 coincides with the interval of the plurality of first electrodes 1218 of the lower inspection substrate 1210, by detaching the intermediate substrate 40 corresponding to a region (coordinate) of the defective LED from the lower inspection substrate 1210, and then applying a force in the horizontal direction to the intermediate substrate 40. This is to use the elasticity or stretch of the intermediate substrate 40. In addition, the intermediate substrate 40 may be attached to the lower inspection substrate 1210 such that the conductive materials 48 of the intermediate substrate 40 contact the plurality of first electrodes 1218 of the lower inspection substrate 1210. Thereafter, the optical inspection may be performed through the lower and upper inspection substrates 1210 and 1220 attached to the intermediate substrate 40 again.

On the other hand, when the defective LED is identified, the LED and the intermediate substrate 40 corresponding to the identified region may be detached and removed. That is, some regions may be detached from the intermediate substrate 40 through various methods (a physical force, a chemical method, and the like).

Here, when the inspection operation is completed, the inspection substrates 1210 and 1220 may be detached from the intermediate substrate 40 as illustrated in FIG. 12A.

Thereafter, the LED 50 may be electrically connected to the driving circuit layer 20 through the conductive material (S540). This will be described in more detail with reference to FIGS. 13A to 13E and 14A to 14D.

FIGS. 13A to 13E are views for describing an operation of bonding an intermediate substrate onto a driving circuit layer according to an embodiment of the disclosure.

Figure 13A:
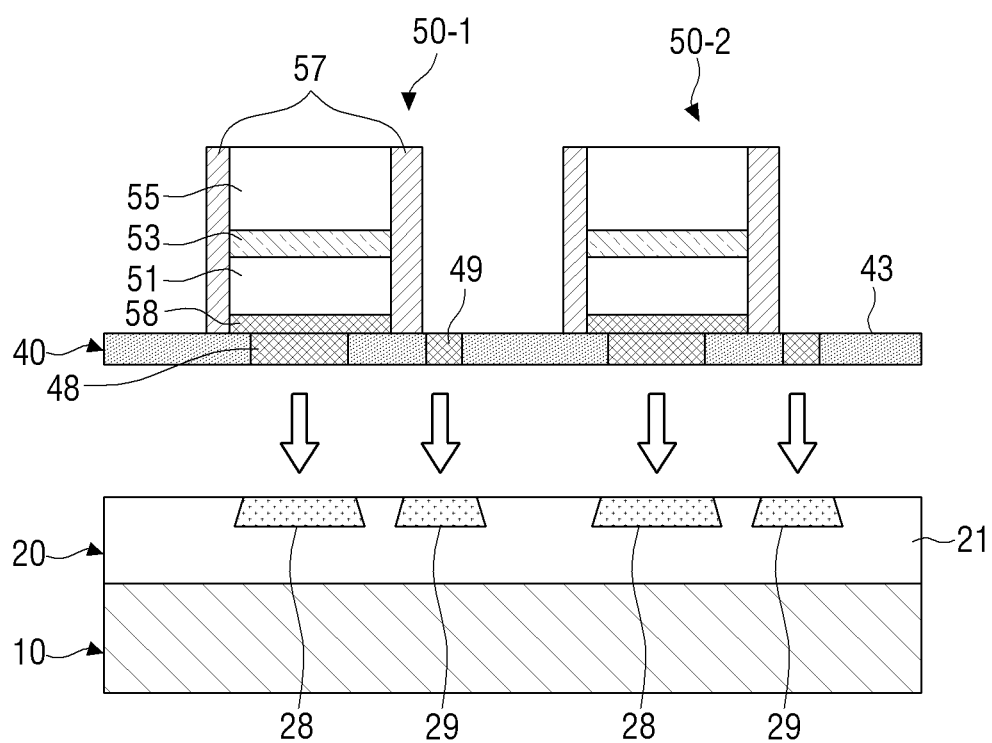
FIG. 13A is a view for describing an operation of bonding an intermediate substrate onto a substrate 10 according to an embodiment of the disclosure.

Here, FIG. 13A illustrates a state before the intermediate substrate 40 on which the LEDs 50-1 and 50-2 having the state in which the reflective electrode is not formed, that is, a structure in which the emission direction is both side is bonded onto the driving circuit layer 20, according to an embodiment of the disclosure.

Referring to FIG. 13A, the intermediate substrate 40 may be attached onto the driving circuit layer 20 disposed on the substrate 10 to electrically connect the first type semiconductor layers 51 of the plurality of LEDs 50 attached onto the intermediate substrate 40 to the driving circuit layer 20.

Here, the driving circuit layer 20 may include a plurality of pixel circuits 21 and a first electrode 28 and a second electrode 29 electrically connected to each of the plurality of pixel circuits 21. Here, the description of the driving circuit layer 20 overlaps the contents described above and will be thus omitted.

Specifically, the intermediate substrate 40 may be attached onto the driving circuit layer 20 through the adhesive material 43. Here, the intermediate substrate 40 may be attached onto the driving circuit layer 20 so that the lower portion of the intermediate substrate 40 is positioned on the driving circuit layer 20 in a state in which the plurality of LEDs 50-1 and 50-2 are bonded onto the intermediate substrate 40. The intermediate substrate 40 may be directly bonded onto the driving circuit layer 20.

In this case, the first type semiconductor layer 51 of each of the plurality of LEDs 50 may be electrically connected to the first electrode 28 of the driving circuit layer 20 through the conductive materials 48 and 58.

According to an embodiment, the intermediate substrate 40 may be attached onto the driving circuit layer 20 through various methods such as reel to reel, roller pressing, vacuum pressing, and pressing in which a plate moves and presses in a vertical direction. For example, in the case of the roller pressing method, the intermediate substrate 40 on which the LEDs 50 are formed and the driving circuit layer 20 (or the substrate 10 on which the driving circuit layer 20 is formed) may be disposed in one direction. In this case, when the roller presses the intermediate substrate 40 while rotating, the intermediate substrate 40 may be attached onto the roller while being wound. When the roller presses the driving circuit layer 20 while rotating again, the intermediate substrate 40 attached to the roller may be transferred to and attached onto the driving circuit layer 20.

Figure 13B:
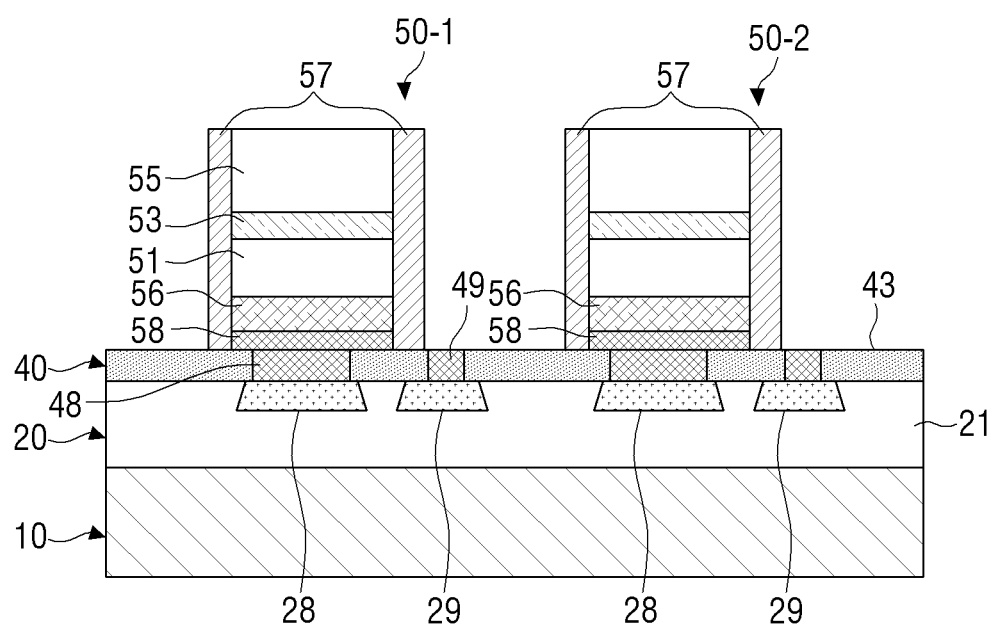
FIG. 13B is a view for describing an operation of bonding an intermediate substrate onto a substrate 10 according to an embodiment of the disclosure.

On the other hand, when the intermediate substrate 40 in the state in which the LEDs 50-1 and 50-2 having the structure in which the emission direction is the top side are formed is bonded onto the driving circuit layer 20 according to an embodiment of the disclosure, the conductive material 48 may be electrically connected to the first electrode 28 of the driving circuit layer 20, and the conductive material 49 may be electrically connected to the second electrode 29 of the driving circuit layer 20, as illustrated in FIG. 13B. In this case, the first type semiconductor layers 51 of the LEDs 50-1 and 50-2 may be electrically connected to the first electrodes 28 of the driving circuit layer 20 through the reflective electrodes 56 formed on the lower portion of the LEDs 50-1 and 50-2 and the conductive materials 58 and 48.

Figure 13C:
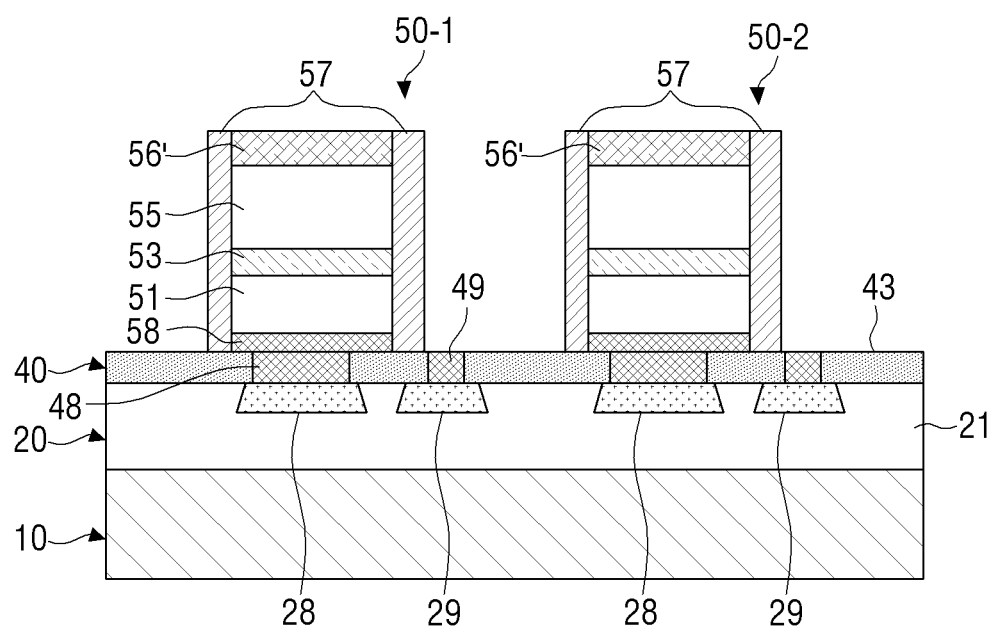
FIG. 13C is a view for describing an operation of bonding an intermediate substrate onto a substrate 10 according to an embodiment of the disclosure.

On the other hand, when the intermediate substrate 40 in the state in which the LEDs 50-1 and 50-2 having the structure in which the emission direction is the bottom side are formed is bonded onto the driving circuit layer 20, the conductive material 48 may be electrically connected to the first electrode 28 of the driving circuit layer 20, and the conductive material 49 may be electrically connected to the second electrode 29 of the driving circuit layer 20, as illustrated in FIG. 13C. In this case, the first type semiconductor layers 51 of the LEDs 50-1 and 50-2 may be electrically connected to the first electrodes 28 of the driving circuit layer 20 through the conductive materials 58 and 48.

The intermediate substrate 40 according to an embodiment of the disclosure as described above may be directly bonded onto the driving circuit layer 20 without other media.

Figure 13D:
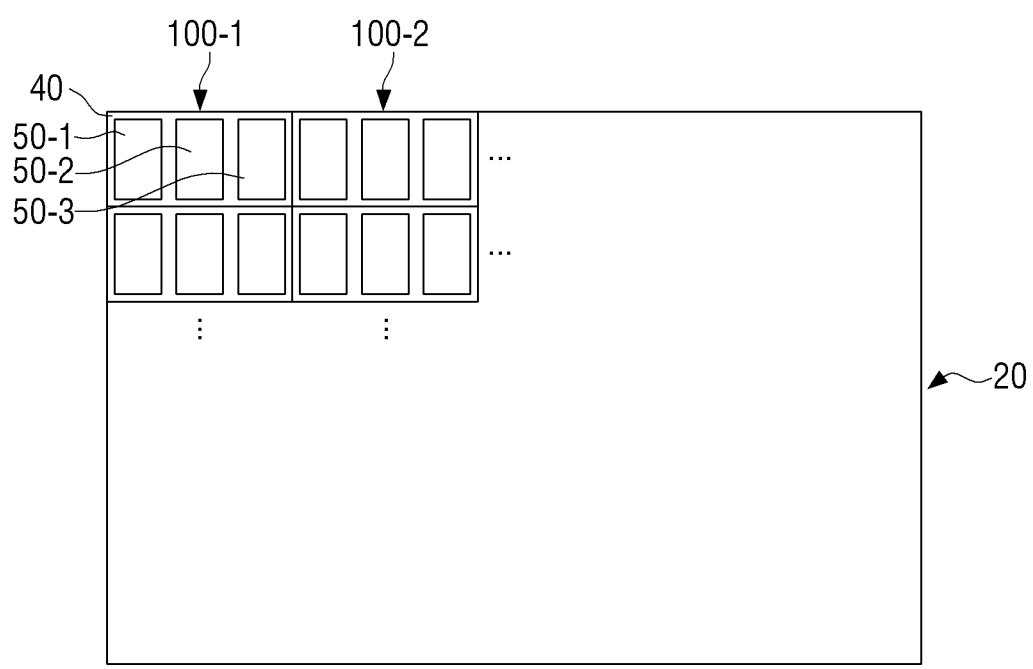
FIG. 13D is a view for describing an operation of bonding an intermediate substrate onto a driving circuit layer according to an embodiment of the disclosure.

According to an embodiment, as illustrated in FIG. 13D, the intermediate substrate 40 may be attached onto the driving circuit layer 20 in units of pixels 100-1 and 100-2. That is, the intermediate substrate 40 comprising the LEDs 50 corresponding to the pixels 100-1 and 100-2 may be attached onto the driving circuit layer 20. Here, each of the pixels 100-1 and 100-2 may include a single LED 50, or may include a plurality of LEDs 50-1, 50-2, and 50-3.

Figure 13E:
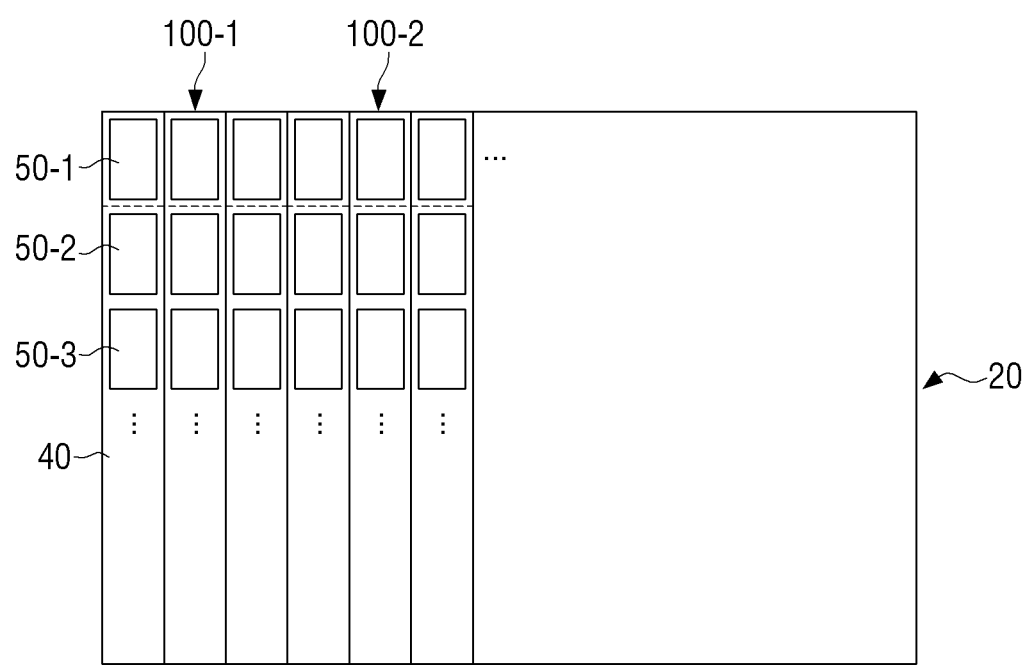
FIG. 13E is a view for describing an operation of bonding an intermediate substrate onto a driving circuit layer according to an embodiment of the disclosure.

As another example, as illustrated in FIG. 13E, the intermediate substrate 40 may be attached onto the driving circuit layer 20 in units of columns (or rows) of the LEDs 50. That is, an intermediate substrate 40 comprising at least one column (or row) of LEDs 50 may be attached onto the driving circuit layer 20. Here, the LEDs 50-1, 50-2, and 50-3 corresponding to one column (or row) may be LEDs formed to emit the same color (e.g., red) (i.e., sub-pixels of the same type (color)).

Accordingly, the display module 1 and the manufacturing method thereof according to the disclosure may improve a transfer speed for the plurality of LEDs 50 and may improve the overall production yield.

On the other hand, the intermediate substrate 40 may include a prepreg to have elasticity or stretch and adhesiveness. Accordingly, when a defective LED occurs among the plurality of LEDs 50-1 and 50-2, the defective LED and the intermediate substrate 40 of the portion comprising the defective LED may be removed together as a sticker. A defect may be repaired by attaching the intermediate substrate 40 to which the plurality of separate LEDs 50-1 and 50-2 are bonded to the portion where the intermediate substrate 40 on the driving circuit layer 20 is removed.

Figure 14A:
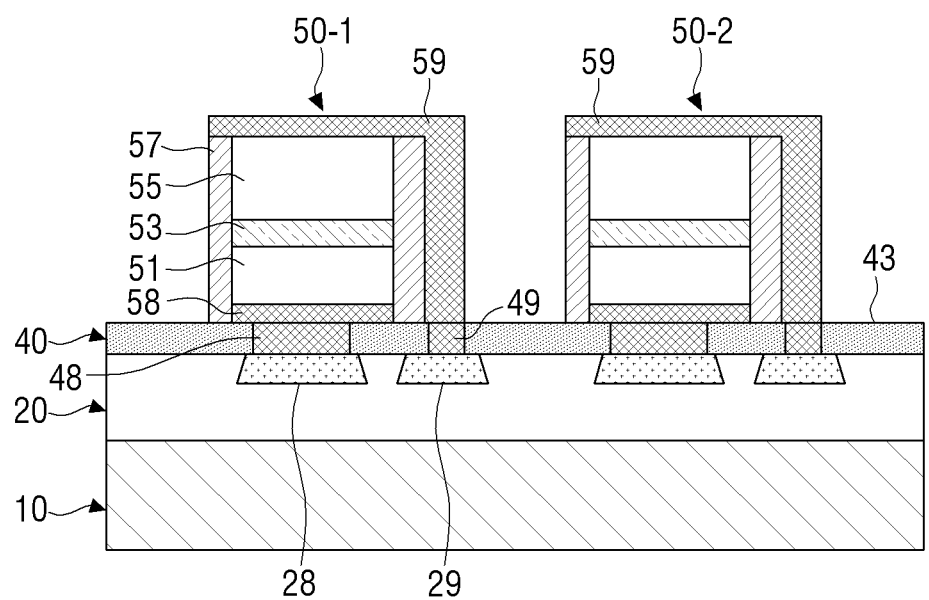
FIG. 14A is a view for describing an operation of forming electrodes according to an embodiment of the disclosure.
Figure 14B:
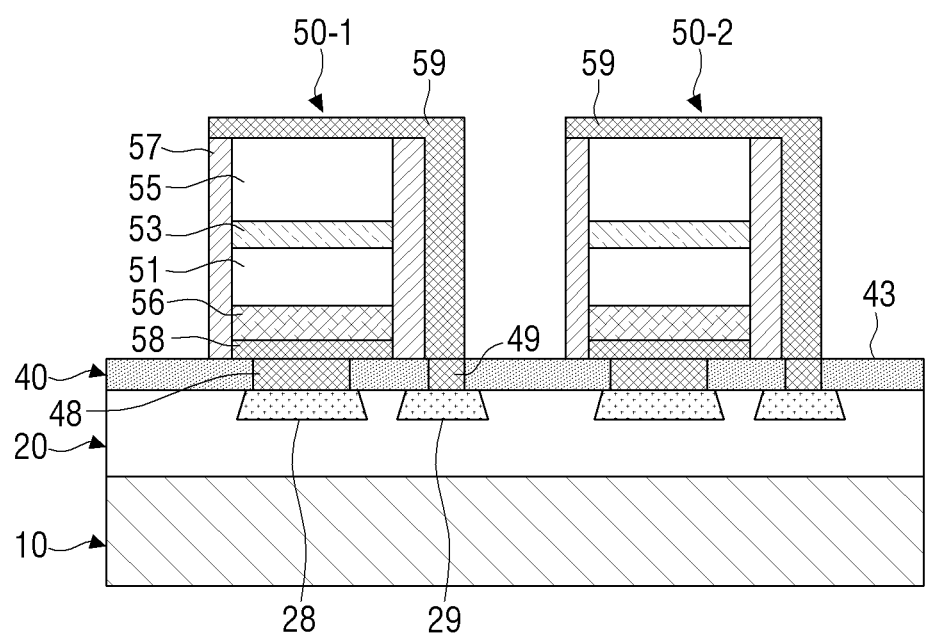
FIG. 14B is a view for describing an operation of forming electrodes according to an embodiment of the disclosure.
Figure 14C:
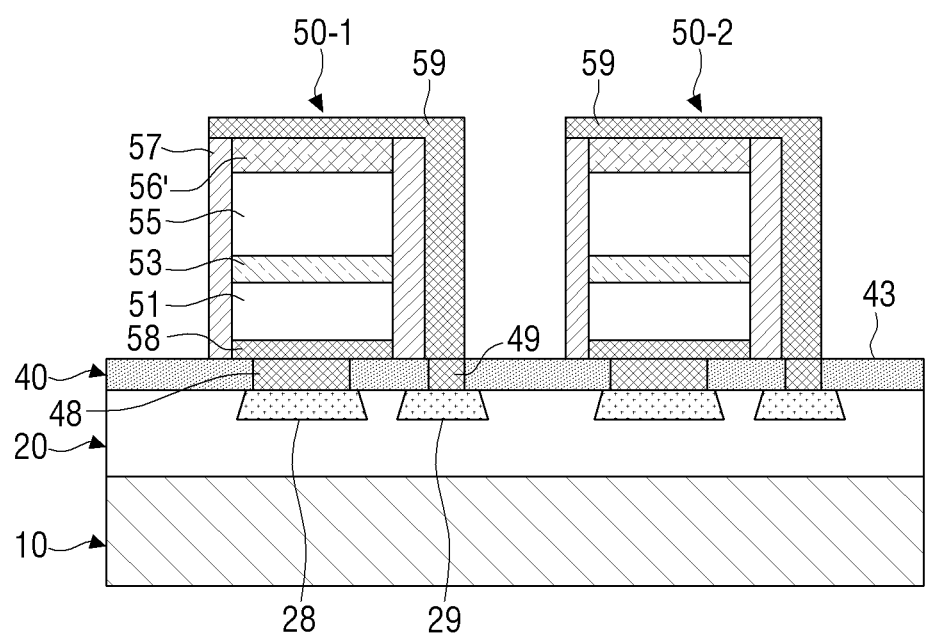
FIG. 14C is a view for describing an operation of forming electrodes according to an embodiment of the disclosure.
Figure 14D:
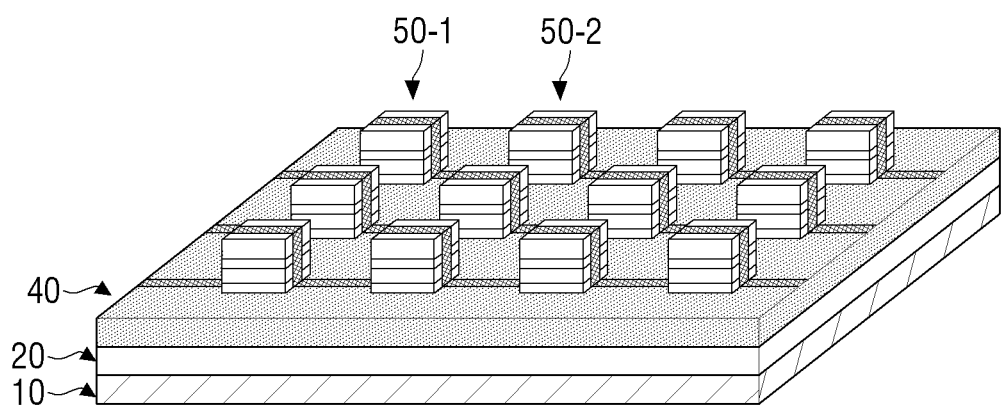
FIG. 14D is a view for describing an operation of forming electrodes according to an embodiment of the disclosure.

FIGS. 14A to 14D are views for describing a display module manufactured according to an embodiment of the disclosure. Here, FIG. 14A is a view for describing a structure in which the emission direction is both side as the LEDs 50-1 and 50-2 in a state in which a reflective electrode is not formed according to an embodiment of the disclosure, FIG. 14B is a view for describing a structure in which an emission direction is the top side as the LEDs 50-1 and 50-2 in a state in which the reflective electrode 56 is formed on the lower portions thereof according to an embodiment of the disclosure, FIG. 14C is a view for describing a structure in which an emission direction is the bottom side as the LEDs 50-1 and 50-2 in a state in which the reflective electrode 56' is formed on the upper portions thereof according to an embodiment of the disclosure, and FIG. 14D is a view illustrating an arrangement of a plurality of LEDs 50-1 and 50-2 in the display module.

Referring to FIGS. 14A to 14D, the second type semiconductor layers 55 of the plurality of LEDs 50-1 and 50-2 may be electrically connected to the driving circuit layer 20.

According to an embodiment, an upper electrode 59 of each of the plurality of LEDs 50-1 and 50-2 may be formed. Here, the upper electrode 59 may include at least one of carbon nano tube (CNT), graphene, or metal nano wire, and may be also be implemented as a flexible electrode having flexibility. This overlaps the contents described above, and thus, detailed contents will be omitted.

Here, the upper electrode 59 may be formed through various methods such as a spraying method (e.g., spraying), a lamination method, photolithography, MOVPE, MOCVD, and MBE.

Specifically, the upper electrode 59 may be formed along a side surface of the LED 50. In this case, the second type semiconductor layer 55 may be electrically connected to the second electrode 29 of the driving circuit layer 20 through the transparent electrode 59 and the conductive material 49 of the intermediate substrate 40.

According to an embodiment of the disclosure, the upper electrode 59 of each of the plurality of LEDs 50-1 and 50-2 may be formed along the passivation 57. In this case, the second type semiconductor layer 55 of each of the plurality of LEDs 50-1 and 50-2 may be electrically connected to the second electrode 29 of the driving circuit layer 20 through the upper electrode 59.

Meanwhile, as an example of the disclosure, when the emission direction is both side as illustrated in FIG. 14A or is the top side as illustrated in FIG. 14B, the upper electrode 59 may be configured as a transparent electrode having high light transmittance and electrical conductivity.

For example, the upper electrode 59 may include CNT having high electrical conductivity and transparent properties according to a structure of CNT (e.g., single wall CNT (SW-CNT), multi wall CNT (MW-CNT), and the like), a diameter of CNT, a molecular length of CNT, a concentration (or density) of CNT, and a density of hybrid material (e.g., Ag nano wire and the like).

On the other hand, when the emission direction is the bottom side as illustrated in FIG. 14C, the upper electrode 59 may be configured as an electrode having high electrical conductivity properties. At this time, the upper electrode 59 does not need to be made of a material having a high light transmittance in that it is not a traveling path of light, but is not limited thereto and may be made of various materials.

As described above, in the manufacturing method of the display module 1 according to an embodiment of the disclosure, the display module 1 having the stepless bottom contact structure may be manufactured, unlike the flip chip structure that requires the protrusions (bumps or pads (electrodes)) between the driving circuit layer 20 and the LED 50 to electrically connect the driving circuit layer 20 and the LED 50.

Here, the display module 1 having the stepless bottom contact structure does not need to form the protrusions such as the pads and bumps by placing a step on each of the lower surfaces of the first and second type semiconductor layers 51 and 55 of the LED 50 in that the display module 1 having the stepless bottom contact structure may electrically connect the driving circuit layer 20 and the LED 50 through the intermediate substrate 40. That is, the intermediate substrate 40 may replace the protrusions such as the pads and bumps.

Accordingly, the display module 1 having the stepless bottom contact structure may maximize the areas of the first type semiconductor layer 51 and the second type semiconductor layer 55, and as a result, the light emitting area of the light emitting layer 53 formed between the first type semiconductor layer 51 and the second type semiconductor layer 55 may be maximized to improve the light emission efficiency.

In addition, the display module 1 having the stepless bottom contact structure may prevent the risk of short occurrence of the two electrodes in that the two electrodes (or pads) of the LED 50 are formed at different positions, such as the upper and lower portions of the LED 50. In particular, when the LED 50 is miniaturized, compared to the flip chip structure in which the two electrodes are positioned on the lower portion of the LED 50, the stepless bottom contact structure in which the two electrodes are positioned on the upper and lower portions of the LED 50 may effectively prevent the risk of short circuit occurrence.

Figure 15:
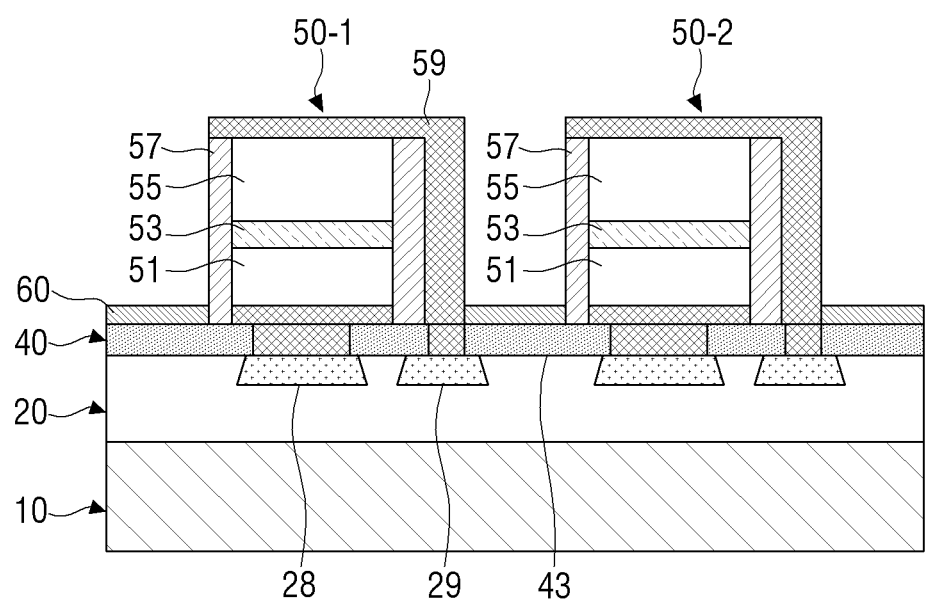
FIG. 15 is a view for describing an operation of forming black matrices according to an embodiment of the disclosure.

FIG. 15 is a view for describing a black matrix according to an embodiment of the disclosure.

Referring to FIG. 15, the manufacturing method according to an embodiment of the disclosure may further include an operation of forming a black matrix 60 on the intermediate substrate 40 in a region between the plurality of LEDs 50-1 and 50-2.

Here, the black matrix 60 may include a material that absorbs light and exhibits a black color. In addition, the black matrix 60 may include a material having high resistance properties (or insulating properties). According to an embodiment, the black matrix 60 may include various materials such as CNT, polymer, and metal oxide, and may be formed through a spraying method, a lamination method, MOCVD, MOVPE, MBE deposition, or the like.

In particular, when the CNT is used as the black matrix 60, CNT having low electrical conductivity and light absorption properties may be used according to a structure of CNT (e.g., single wall CNT (SW-CNT), multi wall CNT (MW-CNT), and the like), a diameter of CNT, a molecular length of CNT, a concentration (or density) of CNT, and a density of hybrid material (e.g., Ag nano wire or the like).

Accordingly, the manufacturing method according to an embodiment of the disclosure has an effect that the black matrix 60 may be formed through a simpler process, and the black matrix 60 having excellent external light absorption properties may be formed.

According to the diverse embodiments of the disclosure as described above, the display module and the manufacturing method thereof that solve various problems such as a defect rate, a non-illumination rate, and a reduction in yield of the related art μ-LED process while alleviating the limitations of the related art μ-LED structure may be provided.

In addition, according to one or more embodiments of the disclosure, an effect of reducing the cost and an effect of improving the reliability are expected by solving the reducing in yield through simplification of the process and solving of issues of the process such as the short circuit occurrence and the non-illumination defect.

While the drawings accompanying the disclosure are provided to help understand the technical spirit of the disclosure, the technical spirit of the disclosure is not limited by the relative sizes or intervals of various elements, regions, and the like illustrated in the drawings.

One or more embodiments of the disclosure may be implemented by software comprising instructions that are stored in machine (e.g., a computer)-readable storage media. The machine is a device that invokes the stored instructions from the storage media and is operable according to the invoked instructions, and may include an electronic device according to the disclosed embodiments. When the commands are executed by the processor, the processor may perform functions corresponding to the commands, either directly or using other components under the control of the processor. The commands may include codes generated or executed by a compiler or an interpreter. The machine-readable storage media may be provided in the form of non-transitory storage media. Here, the term 'non-transitory' means that the storage medium does not include a signal and is tangible, but does not distinguish whether data is stored semi-permanently or temporarily in the storage medium.

The method according to one or more embodiments may be provided as being included in a computer program product. The computer program product may be traded as a product between a seller and a purchaser. The computer program product may be distributed in the form of a machine readable storage medium (e.g., a compact disc read only memory (CD-ROM)), or online through an application store (e.g., PlayStore™). In case of the online distribution, at least a portion of the computer program product may be at least temporarily stored or be temporarily generated in a storage medium such as a server of a manufacturer, a server of an application store, or a memory of a relay server.

Each of the components (e.g., modules or programs) according to the one or more embodiments may include a single entity or a plurality of entities, and some sub-components of the sub-components described above may be omitted, or other sub-components may be further included in the one or more embodiments. Alternatively or additionally, some components (e.g., modules or programs) may be integrated into one entity to perform the same or similar functions performed by the respective components prior to the integration. The operations performed by the module, the program, or other component, in accordance with the one or more embodiments may be executed in a sequential, parallel, iterative, or heuristic manner, or at least some operations may be executed in a different order or omitted, or other operations may be added.

Although the embodiments of the disclosure have been illustrated and described hereinabove, the disclosure is not limited to the specific embodiments described above, but may be variously modified by those skilled in the art to which the disclosure pertains without departing from the scope and spirit of the disclosure claimed in the accompanying claims. Such modifications should not be individually understood from the technical spirit or the prospect of the disclosure.

What is claimed is:

1. A method of manufacturing a display module, the method comprising:
    forming an epitaxial film comprising a light emitting layer, a first type semiconductor layer, and a second type semiconductor layer provided in a vertically stacked arrangement;
    attaching the epitaxial film onto an intermediate substrate, after forming the epitaxial film in the vertically stacked arrangement, the intermediate substrate comprising a conductive material;
    patterning the epitaxial film to form a light emitting diode (LED); and
    electrically connecting the LED to a driving circuit layer through the conductive material.

2. The method as claimed in claim 1, wherein the connecting the LED to the driving circuit layer comprises:
    attaching the intermediate substrate onto the driving circuit layer formed on a substrate to electrically connect the first type semiconductor layer of the LED to the driving circuit layer through the conductive material and to electrically connect the second type semiconductor layer of the LED to the driving circuit layer through the conductive material.

3. The method as claimed in claim 2, wherein the LED has a vertical structure, and
    the conductive material comprises at least one of carbon nano tube (CNT), graphene, or metal nano wire.

4. The method as claimed in claim 3, wherein the driving circuit layer comprises a pixel circuit, and a first electrode and a second electrode coupled to the pixel circuit to electrically connect the first electrode and the second electrode to the pixel circuit.

5. The method as claimed in claim 4, further comprising forming a passivation element on a sidewall of the LED.

6. The method as claimed in claim 5, wherein the connecting the second type semiconductor layer of the LED to the driving circuit layer comprises:
    forming a transparent electrode along the passivation element; and
    electrically connecting the second type semiconductor layer of the LED to the second electrode of the driving circuit layer through the transparent electrode and the conductive material.

7. The method as claimed in claim 6, further comprising forming a black matrix on the intermediate substrate in a region between the LED and another LED.

8. The method as claimed in claim 4, wherein the intermediate substrate further comprises an adhesive material, and
    wherein the intermediate substrate is attached onto the driving circuit layer through the adhesive material to electrically connect the first type semiconductor layer of the LED to the first electrode of the driving circuit layer through the conductive material.

9. The method as claimed in claim 8, wherein the adhesive material comprises at least one of epoxy, polyimide, or phenol.

10. The method as claimed in claim 2, further comprises forming a reflective electrode on a lower portion of the first type semiconductor layer or an upper portion of the second type semiconductor layer.

11. The method of claim 1, wherein the attaching the epitaxial film onto the intermediate substrate comprises the attaching the epitaxial film onto the intermediate substrate using an adhesive portion of the intermediate substrate.

12. The method of claim 1, wherein the attaching the epitaxial film onto the intermediate substrate comprises the attaching the epitaxial film directly onto the intermediate substrate.

13. The method of claim 12, wherein the first type semiconductor layer or the second type semiconductor layer is in direct contact with the intermediate substrate.

14. The method as claimed in claim 1,
    wherein the conductive material comprises a first conductive portion configured to connect to the first type semiconductor layer of the LED, and a second conductive portion configured to connect to the second type semiconductor layer of the LED.

15. The method as claimed in claim 14, wherein the connecting the LED to the driving circuit layer comprises:
    attaching the intermediate substrate onto the driving circuit layer formed on a substrate to electrically connect the first type semiconductor layer of the LED to the driving circuit layer through the first conductive portion of the conductive material and to electrically connect the second type semiconductor layer of the LED to the driving circuit layer through the second conductive portion of the conductive material.

* * * * *